(12) United States Patent
Miyazaki et al.

(10) Patent No.: US 6,998,926 B2
(45) Date of Patent: Feb. 14, 2006

(54) PIEZOELECTRIC OSCILLATOR, PORTABLE PHONE EMPLOYING PIEZOELECTRIC OSCILLATOR, AND ELECTRONIC APPARATUS EMPLOYING PIEZOELECTRIC OSCILLATOR

(75) Inventors: Katsuhiko Miyazaki, Minowa-machi (JP); Yugo Koyama, Ina (JP); Yukihiro Unno, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 84 days.

(21) Appl. No.: 10/735,676

(22) Filed: Dec. 16, 2003

(65) Prior Publication Data

US 2004/0178858 A1 Sep. 16, 2004

(30) Foreign Application Priority Data

Dec. 17, 2002 (JP) .............................. 2002-365530

(51) Int. Cl.
*H03B 5/32* (2006.01)

(52) U.S. Cl. .................. 331/68; 331/108; 310/348
(58) Field of Classification Search ................ 331/68, 331/158, 108 D; 310/348; 361/813, 753
See application file for complete search history.

(56) References Cited

U.S. PATENT DOCUMENTS

| 5,949,294 | A | * | 9/1999 | Kondo et al. ............... 331/68 |
| 6,229,404 | B1 | * | 5/2001 | Hatanaka ..................... 331/68 |
| 6,882,232 | B2 | * | 4/2005 | Harima ........................ 331/68 |

FOREIGN PATENT DOCUMENTS

| JP | 57-87544 | 11/1980 |
| JP | A 63-244905 | 10/1988 |
| JP | A 4-334202 | 11/1992 |
| JP | Y2 5-16724 | 5/1993 |
| JP | B2 2621828 | 4/1997 |
| JP | B2 3101996 | 8/2000 |
| JP | A 2001-332932 | 11/2001 |
| JP | A 2003-179432 | 6/2003 |

* cited by examiner

*Primary Examiner*—Joseph Chang
(74) *Attorney, Agent, or Firm*—Oliff & Berridge, PLC

(57) ABSTRACT

To provide a piezoelectric oscillator in which, even after a first package and a second package are bonded to each other, the connection state can be easily observed externally, so that testability can be enhanced, and connection failure can be easily found out to perform a repair. A piezoelectric oscillator includes a first package housing a piezoelectric resonator element therein and having external terminal portions connected to excitation electrodes of the piezoelectric resonator element, and a second package housing an oscillating circuit element, the first package being superposed on and fixed to the second package. Herein, in the second package, the oscillating circuit element, which is connected to a lead frame, is molded out of resin, and connection terminal portions and mounting terminals formed of the lead frame are exposed at the second package. Furthermore, the external terminal portions of the first package are exposed at the side surfaces of the first package, and the external terminal portions and the connection terminal portions of the second package are electrically connected to each other by a conductive material.

11 Claims, 17 Drawing Sheets

FIRST EMBODIMENT

THIRD EMBODIMENT

PIEZOELECTRIC OSCILLATOR, PORTABLE PHONE EMPLOYING PIEZOELECTRIC OSCILLATOR, AND ELECTRONIC APPARATUS EMPLOYING PIEZOELECTRIC OSCILLATOR

BACKGROUND OF THE INVENTION

1. Field of Invention

The present invention relates to a piezoelectric oscillator including a piezoelectric resonator element and an oscillating circuit element to oscillate the piezoelectric resonator element, and a portable phone and an electronic apparatus employing the piezoelectric oscillator.

2. Description of Related Art

Piezoelectric oscillators are widely used in packages of small-sized information apparatuses, such as HDDs (Hard Disk Drives), mobile computers, and IC cards, or mobile communication apparatuses, such as portable phones, car phones, and paging systems.

A related art piezoelectric oscillator includes a piezoelectric vibrating unit having a piezoelectric resonator element and an oscillating circuit unit having an oscillating circuit element to oscillate the piezoelectric resonator element, and specifically a structure to house them in two different packages and fix the two packages.

In the structure to fix two packages to each other, a structure to superpose and fix two packages is known in the related art as a structure to mutually fix packages housing separate semiconductor elements, respectively. See Japanese Unexamined Utility Model Registration Application Publication No. 57-87544).

FIG. 32 is a schematic cross-sectional view illustrating such a semiconductor device 1. In the semiconductor device 1 shown in the figure, a first package 3 houses a first semiconductor element 4, and is covered with a cover 4a. A second package 2, on which the first package 3 is superposed, is a resin package, in which a second semiconductor element 6 is fixed to lead frames 5 and is molded out of resin 7. End portions of the lead frames 5 extend laterally and upwardly, and the end portions extending laterally are bent downward at the outside of the package to form mounting terminals 5a. The end portions of the lead frames 5 extending upwardly are exposed at a top surface of the second package 2 to form connection terminals 8.

The connection terminals 8 of the second package 2 are connected to external terminals 10 exposed at a bottom surface of the first package 3 by solder 9.

In this way, the first package 3 is electrically connected and bonded to the second package, and superposed on the second package 2.

This structure can avoid various disadvantages occurring when two kinds of semiconductor elements are housed in the same package.

That is, since two kinds of semiconductor elements are housed in a resin package, it is possible to avoid a disadvantage that the whole product cannot be used when any one of the semiconductor elements has defects. Specifically, in a case where it is intended to form a piezoelectric oscillator using a piezoelectric resonator element and an oscillating circuit element, not separate semiconductor elements, if they are housed in one package, gas generated in curing can be attached to the piezoelectric resonator element to cause deterioration of performance.

Therefore, similar to the aforementioned semiconductor device 1, these disadvantages can be avoided and a small-sized piezoelectric oscillator can be realized by housing the piezoelectric resonator element and the oscillating circuit element in separate packages, respectively and by superposing the packages vertically.

However, since a bottom surface of the first package 3 of the semiconductor device 1 is provided with the external terminals 10, its connection state to the second package is not visible from the outside, after the first package is connected and fixed to the second package 2.

Therefore, there is a problem in which a quality inspection, based on a product appearance, cannot be performed sufficiently.

SUMMARY OF THE INVENTION

The present invention provides a piezoelectric oscillator, in which an electrical connection state can be easily observed externally, even after a first package and a second package are bonded to each other, so that testability can be enhanced and connection failure can be easily found out to perform a repair. The present invention also provides a portable phone and an electronic apparatus employing the piezoelectric oscillator.

The above can be accomplished by a first aspect of the invention which provides a piezoelectric oscillator including a first package housing a piezoelectric resonator element therein and having external terminal portions connected to excitation electrodes of the piezoelectric resonator element and a second package housing an oscillating circuit element constituting an oscillating circuit, the first package being superposed on and fixed to the second package. Here, in the second package, the oscillating circuit element, which is connected to a lead frame, is molded out of resin, and connection terminal portions and mounting terminals formed out of the lead frame are exposed at the second package. The external terminal portions of the first package are exposed at side surfaces of the first package, and the external terminal portions and the connection terminal portions of the second package are electrically connected to each other by a conductive material.

According to the first aspect of the invention, the first package housing the piezoelectric resonator element and the second package housing the oscillating circuit element are superposed and fixed to each other, and the first package and the second package are electrically connected to each other at the external terminal portions exposed at the side surfaces of the first package and at the connection terminal portions of the second package.

For this reason, it is possible to avoid the disadvantages occurring when the piezoelectric resonator element and the oscillating circuit element are housed together in one package. In addition, it is possible to realize a compact piezoelectric oscillator having a small mounting space by superposing and fixing the two packages to each other. Furthermore, since the two packages are connected to each other in places on the side surfaces of the first package, the connection portions are not hidden between the packages, so that the connection state can be externally visible.

Therefore, testability can be enhanced, and connection failure can be easily found out, so that it is possible to easily perform necessary repair externally.

In a second aspect of the invention having the construction of the first aspect of the invention, material-removed portions are formed in the peripheral edge portions of the first package, and the material-removed portions are provided with the external terminal portions.

According to the construction of the second aspect of the invention, by applying a conductive material using spaces generated due to the material-removed portions of the first package, it is possible to perform the electrical connection between the first package and the second package. Therefore, even if a method of applying the conductive material using the side surfaces of the first package is employed, the first package and the second package can be formed substantially in the same outer size, so that it is possible to realize a compact piezoelectric oscillator. As a result, since the first package and the second package can be formed substantially in the same shape having the same outer size, it is possible to easily perform positioning of the bonding portions through the alignment of outer side when the first package and the second package are superposed and fixed to each other.

The "material-removed portions" may be formed in the corner portions by using castrations when forming a rectangular package.

In a third aspect of the invention having the construction of any one of the first and second aspects of the invention, the first package has a laminated structure, conductive patterns are provided in an interlayer thereof, and the conductive patterns are electrically connected to a cover bonded to the first package.

According to the construction of the third aspect of the invention, by making the conductive patterns of the inner layer of the first package have the same potential as the cover, it is possible to realize a shield structure.

In a fourth aspect of the invention having the construction of any one of the first to third aspects of the invention, the external terminal portions are separated from a lower end of the first package by a predetermined gap.

According to the construction of the fourth aspect of the invention, the external terminal portions exposed at the side surfaces of the first package are separated from a lower end of the first package by a predetermined gap. In other word, the external terminal portions are separated from a surface of the first package connected to the second package by the predetermined gap. For this reason, when a method of applying a conductive material to the side surfaces of the first package and then diffusing it downward using a suction device, etc. is used to form the external terminal portions, the conductive material cannot go round into a bottom surface of the first package even if the conductive material goes down along the side surfaces of the first package. That is, since it does not occur that the conductive material curves into the bonding surface of the first package and the second package and thus is cured therein, it does not occur that a bonding posture of the first package is inclined due to the existence of the conductive material on the bonding surface of the first package and the second package.

As a result, on the side surfaces of the first package, places, in which the package material is exposed, are formed below the external terminal portions. Therefore, when the external terminal portions exposed at the side surfaces of the first package and the connection terminal portions of the second package are electrically connected to each other, for example, by a silicon based conductive adhesive, the connection portion of the conductive adhesive to the package outer surface made of ceramics, etc. having a rough surface has a bonding force larger than the connection to the external connection terminal portions on which a gold plating, etc. has been carried out. Therefore, by providing a part of the portion, which contacts the conductive adhesive with a portion in which the outer surface of the package is exposed, they can be more intensively coupled, thereby intensifying the electrical and mechanical connection structure.

In a fifth aspect of the invention having the construction of any one of the first to fourth aspects of the invention, inspection terminal portions connected to the excitation electrodes of the piezoelectric resonator element are exposed at a bottom surface of the first package.

According to the construction of the fifth aspect of the invention, when the first package is formed and then the first package is independently inspected, it is possible to easily perform the inspection only by mounting the first package on the patterns to apply a driving voltage since the inspection terminal portions are exposed at the bottom surface of the first package. After the first package and the second package are fixed to each other, the inspection terminals are invisible externally since the inspection terminals are positioned between the first package and the second package.

In a sixth aspect of the invention having the construction of any one of the first to fifth aspects of the invention, concave portions are formed on a surface of the first package bonded to the second package.

According to the construction of the sixth aspect of the invention, by filling the concave portions with an adhesive, a bonding area with the adhesive becomes larger, and thus it is possible to enhance a fixing force of the first package to the second package.

In a seventh aspect of the invention having the construction of the sixth aspect of the invention, the inspection terminal portions connected to the excitation electrodes of the piezoelectric resonator element are exposed at the concave portions.

According to the construction of the seventh aspect of the invention, the concave portions can be used to position a test jig for test pins when the first package is inspected before fixing the first package to the second package, as well as serving as filling regions of the adhesive.

In an eighth aspect of invention having the construction of any one of the first to seventh aspects of the invention, places where the external terminal portions of the first package and the connection terminal portions of the second package are connected to each other by the conductive material, and/or the inspection terminal portions are coated with a non-conductive material.

According to the construction of the eighth aspect of the invention, when the conductive or electrically-connected places are exposed externally after carrying out the electrical connection between the first package and the second package, an oscillation frequency may be varied in the conductive places other than an earthed cover due to the attachment of foreign substances, such as solder or flux thereto. Therefore, by coating the conductive places of such concern with the non-conductive material, the aforementioned disadvantages can be avoided.

In a ninth aspect of the invention having the construction of any one of the first to eighth aspects of the invention, a convex portion is formed between the external terminal portions provided on the side surfaces of the first package and a cover bonded to the first package.

According to the construction of the ninth aspect of the invention, when the conductive material is applied to the external terminal portions to carry out the electrical connection to the second package side, the melted conductive material may flow to come in contact with the cover made of metal, and thus the cover and the piezoelectric resonator element may be electrically connected to each other into leakage. Therefore, for example, by forming a part of the package in a shade shape using the convex portion, it is possible to reduce or prevent the conductive material from flowing toward the cover.

Further, since the conductive patterns are formed in an area of the convex portion adjacent to the external terminal portions, an area, into which the conductive material to connect to the second package is melted and diffused, can be enlarged in the side surfaces of the first package. Thus, it is possible to surely perform the electrical connection.

In a tenth aspect of the invention having the construction of any one of the first to ninth aspects of the invention, the second package includes a first lead frame and a second lead frame, end portions of the first lead frame are bent in a direction receding from the first package and are exposed externally to form first connection terminal portions, end portions of the second lead frame are bent in a direction approaching the first package and are exposed externally to form second connection terminal portions, the first connection terminal portions and the second connection terminal portions are arranged to two-dimensionally overlap each other, the oscillating circuit element is connected to inner terminals of the first and second lead frames, the first connection terminal portions are used as the mounting terminals, and the second connection terminal portions are used as the connection terminal portions electrically connected to the external terminal portions of the first package.

According to the construction of the tenth aspect of the invention, the second package includes at least the first and second lead frames, the end portions of the first lead frame are bent in a direction receding from the first package and are exposed externally to form the first connection terminal portions, and the end portions of the second lead frame are bent in a direction approaching the first package and are exposed externally to form the second connection terminal portions. The first connection terminal portions are used as the mounting terminals, and the first package and the second package are electrically connected to each other by the second connection terminal portions. For example, separate lead frames are used to connect the second package to a mounting substrate, on which the piezoelectric oscillator is mounted, and to electrically connect the first package to the second package. As a result, the first and second lead frames, which are the separate lead frames, can be arranged to vertically overlap each other. That is, since end portions to be bent upward and downward do not have to be formed in a lead frame, the horizontal size of a necessary lead frame can be limited, so that it is possible to make the horizontal size of the piezoelectric oscillator as small as possible.

Therefore, it is possible to provide a piezoelectric oscillator in which a mounting area can be reduced.

Furthermore, the above can be also accomplished by an eleventh aspect of the invention which provides a portable phone employing a piezoelectric oscillator including a first package housing a piezoelectric resonator element therein and having external terminal portions connected to excitation electrodes of the piezoelectric resonator element, and a second package housing an oscillating circuit element constituting an oscillating circuit, the first package being superposed on and fixed to the second package. Here, the portable phone obtains control clock signals using the piezoelectric oscillator. In the second package, the oscillating circuit element, which is connected to a lead frame, is molded out of resin. Connection terminal portions and mounting terminals, formed out of the lead frame, are exposed at the second package. The external terminal portions of the first package are exposed at the side surfaces of the first package, and the external terminal portions and the connection terminal portions of the second package are electrically connected to each other by a conductive material.

Furthermore, the above can be also accomplished by a twelfth aspect of the invention which provides an electronic apparatus employing a piezoelectric oscillator including a first package housing a piezoelectric resonator element therein and having external terminal portions connected to excitation electrodes of the piezoelectric resonator element, and a second package housing an oscillating circuit element constituting an oscillating circuit, the first package being superposed on and fixed to the second package. Here, the electronic apparatus obtains control clock signals using the piezoelectric oscillator. In the second package, the oscillating circuit element, which is connected to a lead frame, is molded out of resin, and connection terminal portions and mounting terminals formed out of the lead frame are exposed at the second package. The external terminal portions of the first package are exposed at the side surfaces of the first package. The external terminal portions and the connection terminal portions of the second package are electrically connected to each other by a conductive material.

DETAILED DESCRIPTION OF EXEMPLARY EMBODIMENTS

Figure 1:
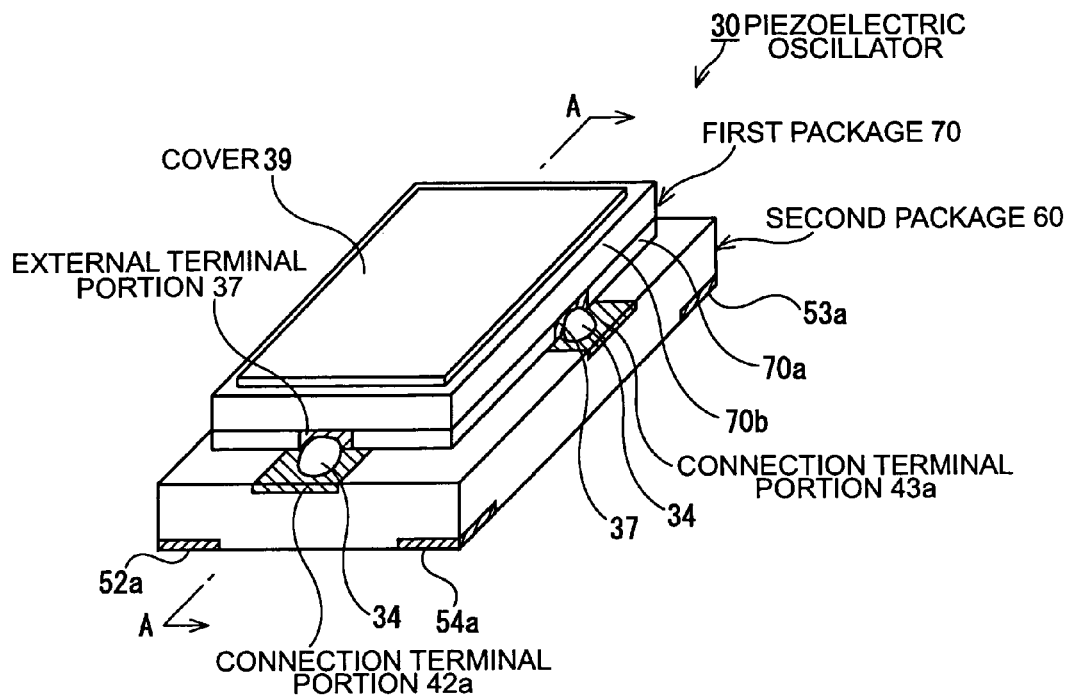
FIG. 1 is a schematic perspective view illustrating a first exemplary embodiment of a piezoelectric oscillator according to the present invention.
Figure 2:
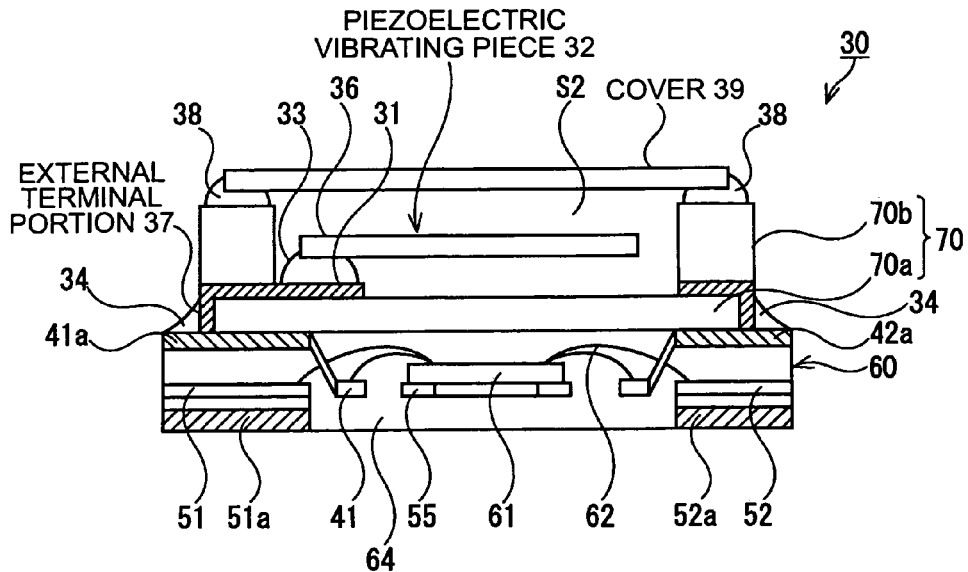
FIG. 2 is a schematic cross-sectional view taken along the plane A—A in the piezoelectric oscillator shown in FIG. 1.

FIGS. 1 and 2 illustrate a first exemplary embodiment of a piezoelectric oscillator according to the present invention, wherein FIG. 1 is a schematic perspective view thereof, and FIG. 2 is a schematic cross-sectional view taken along the plane A—A of FIG. 1.

In the figures, the piezoelectric oscillator 30 includes a second package 60 housing an oscillating circuit element to be described later and a first package 70 being superposed on and fixed to the second package 60 and housing a piezoelectric resonator element 32 therein.

First, a structure of the first package 70 will be described.

The first package 70, as shown in FIG. 2, is formed by laminating and sintering a plurality of substrates 70a and 70b formed by shaping a ceramic green sheet including, for example, aluminum oxide as an insulating material in a rectangular shape. The substrate 70b is formed in a rectangular box shape, of which an upper end is opened, by forming a predetermined hole therein to have a predetermined inner space S2 when laminated.

The inner space S2 is a reception space to house the piezoelectric resonator element 32.

That is, as shown in FIG. 2, in the present exemplary embodiment, electrode portions 31 and 31 formed, for example, by plating metallized tungsten on a surface of the substrate 70a with nickel and gold provided in the inner space S2, which is an almost left end portion of the figure, of the first package 70, to be exposed to the inner space S2.

The electrode portions 31, as can be seen from FIGS. 1 and 2, are connected integrally to external terminal portions 37 formed to be exposed at the side surfaces of the first package 70, respectively. The external terminal portions are marked at bilaterally symmetrical positions of the first package 70 in FIG. 2. Although the external terminal portions 37 are provided in the vicinity of centers of the sides of the first package 70 having a rectangular shape in FIG. 1, the positions of the external terminal portions are not limited to the illustrated positions only if they are the sides of the package.

As shown in FIG. 2, the external terminal portions 37 are electrically connected to the second package 60 to be described later and supply a driving voltage to the piezoelectric resonator element 32. A conductive adhesive 33 is coated on the electrode portions 31, a base 36 of the piezoelectric resonator element 32 is mounted on the conductive adhesive 33, and they are bonded by the conductive adhesive 33. Accordingly, the external terminal portions 37 are connected to excitation electrodes (not shown) of the piezoelectric resonator element 32 through the conductive adhesive 33 and the electrode portions 31.

On the other hand, an adhesive in which conductive particles, such as fine silver grains are dispersed in synthetic resin, as an adhesive component exhibiting bonding force, can be used as the conductive adhesive 33, and silicon based, epoxy based or polyimide based conductive adhesives, etc. can be used.

The piezoelectric resonator element 32 is made of, for example, crystal. Furthermore, piezoelectric materials, such as lithium tantalate, lithium niobate, etc., can be used in addition to the crystal. The piezoelectric resonator element 32 is formed in a small size, and in order to obtain required performance, the so-called AT cut resonator element obtained by cutting the crystal into a rectangular shape may be used as a piezoelectric resonator element in addition to the so-called tuning fork-shaped resonator element.

In the piezoelectric resonator element 32, the excitation electrodes (not shown) are formed in a predetermined place of the piezoelectric material formed as described above.

The upper end opening of the first package 70 is hermetically sealed, as shown in FIG. 2, preferably by bonding a cover 39 made of a conductive metal thereto using a solder member 38 made of a conductive material.

That is, by forming the solder member 38 and the cover 39 out of metal-based Fe—Ni—Co alloy and by grounding the cover 39, a shield effect can be exhibited. In this case, as described later, the cover 39 should be electrically connected to at least one of the external terminal portions 37 and electrically connected to the earth of the second package 60.

Next, the second package 60 will be described.

The second package 60 is a resin package in which an oscillating circuit element is fixed onto a lead frame to be described later, and the resultant structure is hermetically sealed with resin. In the cross-section of the second package 60 of FIG. 2, terminal portions at positions substantially not cut are hatched, but these are only for the convenience of understanding and show up-and-down (vertical) positions of the terminal portions, not showing the cut planes.

In order to form the second package 60, as described later, a mounting portion and terminal portions of the oscillating circuit element are formed using two different lead frames. From a first lead frame 50 (to be described later), mounting terminals 51a, 52a, 53a, and 54a are formed using end portions exposed at a bottom surface of the second package 60. In FIG. 2, only the mounting terminals 51a and 52a are shown.

From a second lead frame 40 (to be described later), connection terminal portions 41a, 42a, 43a, and 44a are formed using end portions exposed at a top surface of the second package 60. In FIG. 2, only the connection terminal portions 41a and 42a are shown.

An element mounting portion 55 is formed using the first lead frame 50, and the oscillating circuit element 61 is fixed to the element mounting portion 55 by a die bonding, etc. Electronic components, such as one or plural integrated circuits or capacitors, are used as the oscillating circuit element 61. The oscillating circuit element 61 includes at least a predetermined circuit structure to excite the piezoelectric resonator element 32 and preferably includes a thermosensor (not shown) as a temperature detector. As a result, a temperature compensated piezoelectric oscillator can be achieved.

The oscillating circuit element 61 fixed to the element mounting portion 55 is electrically connected to inner terminals (to be described later) of the first lead frame 50 and the second lead frame 40, as shown in FIG. 2, by a wire bonding using metal wires 62, such as Au wires.

The second package 60 is a resin package formed by sealing the aforementioned oscillating circuit element 61, inner terminals connected thereto and the bonding structure with insulating resin 64, in a state where the connection terminal portions 41a, 42a, 43a, and 44a are exposed at the surface thereof and the mounting terminals 51a, 52a, 53a, and 54a are exposed at the lower surface (bottom surface) thereof.

In this way, the first package 70 and the second package 60 are formed. Furthermore, as shown in the figures, by applying a predetermined adhesive (not shown) to the top surface of the second package 60 and by superposing the first package 70 thereon, the first package 70 and the second package 60 are fixed to each other. The external terminal portions 37 exposed at the side surfaces of the first package 70 and the connection terminal portions 41a and 42a of the second package are connected to each other by, for example, a conductive material 34, such as solder or a conductive adhesive, as shown in FIG. 2. In this case, the same thing as the aforementioned conductive adhesive 33 can be used as the conductive material.

In the present exemplary embodiment as constructed above, the first package 70 housing the piezoelectric resonator element 32 and the second package 60 housing the oscillating circuit element 61 are superposed on and fixed to each other. Furthermore, the first package 70 and the second package 60 are electrically connected to each other through the external terminal portions 37 exposed at the side surfaces of the first package 70 and the connection terminal portions 41a and 42a of the second package.

For this reason, it is possible to avoid disadvantages occurring when the piezoelectric resonator element and the oscillating circuit element are housed together in one package. In addition, it is possible to achieve a compact piezoelectric oscillator 30 having a small mounting space by superposing and fixing the two packages 60 and 70 to each other. Moreover, since the two packages 60 and 70 are connected to each other in places on the side surfaces of the first package 70 and the connection portions are not hidden between the packages, the connection state is externally visible. As a result, since testability is enhanced and connection failure can be easily observed, it is possible to easily perform necessary repair externally.

In addition, in the piezoelectric oscillator 30, the oscillating circuit element 61 in the second package 60 is sealed with resin to form a resin package, and separately from this, the piezoelectric resonator element 32 is housed in the first package 70. In this way, it is possible to effectively reduce or prevent the deterioration of performance due to the attachment of gas generated in curing to the piezoelectric resonator element when the piezoelectric resonator element 32 and the oscillating circuit element 61 are housed in one common resin package. Furthermore, since the second package 60 and the first package 70 can be separately manufactured and then combined together, superior products can be combined. Thus, since it is possible to avoid a situation where the whole product cannot be used due to some failed components mounted therein after the completion of the product in a case where the piezoelectric resonator element 32 and the oscillating circuit element 61 are housed in one common resin package, the components can be used without loss.

Figure 3:
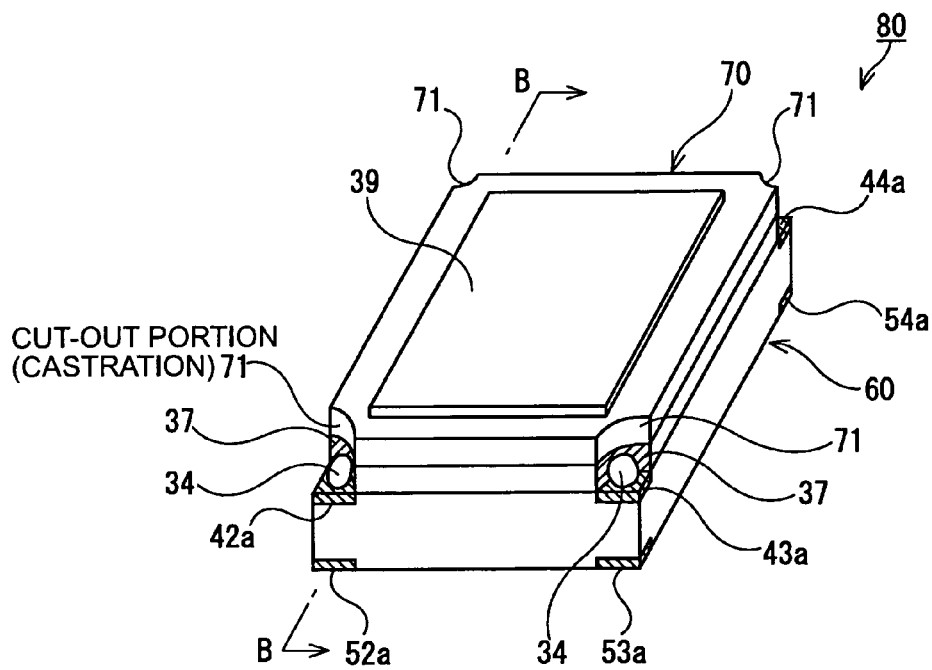
FIG. 3 is a schematic perspective view illustrating a second exemplary embodiment of the piezoelectric oscillator according to the present invention.
Figure 4:
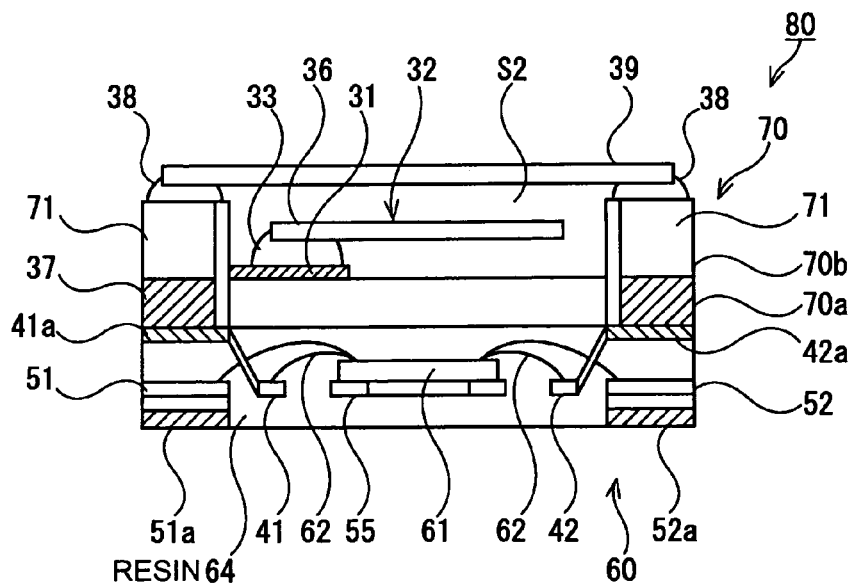
FIG. 4 is a schematic cross-sectional view taken along the plane B—B in the piezoelectric oscillator shown in FIG. 3.

FIGS. 3 and 4 illustrate a second exemplary embodiment of the piezoelectric oscillator according to the present invention, wherein FIG. 3 is a schematic perspective view thereof, and FIG. 4 is a schematic cross-sectional view taken along the plane B—B of FIG. 3. In the figures, since portions denoted by the same reference numerals as in FIGS. 1 and 2 are common, the repeated description thereof will be omitted, and differences will be mainly described.

In these figures, the piezoelectric oscillator 80 is similar to the first exemplary embodiment, except for a shape of the first package 70 and the positions of the connection terminal portions of the second package 60.

In the present exemplary embodiment, material-removed portions are formed at a peripheral edge portion of the first package 70, and the material-removed portions are provided with the external terminal portions 37. For example, as shown in the figures, corner portions, which are a part of the peripheral edge portion of the first package 70 formed in a rectangular shape, are provided with cut-out portions 71 formed by removing the material, and areas of the cut-out portions 71 in the side surfaces of the first package 70 are provided with the external terminal portions 37.

Preferably, the first package 70 and the second package 60 have the same outer size, as shown in the figures, except for the cut-out portions 71.

When the first package 70 is made of ceramics, the cut-out portions 71 can be formed using castrations including through holes formed at positions of four corners of each individual package, to guide the cutting when the individual packages are cut out from a large-area green sheet (not shown).

As a result, in the present exemplary embodiment, by applying the conductive material through spaces generated due to the cut-out portions 71, which are the material-removed portions of the first package 70, the electrical connection between the first package 70 and the second package 60 can be made. For this reason, even if a method of applying the conductive material using the side surfaces of the first package 70 is employed, the first package 70 and the second package 60 can be formed to have almost the same outer size. Thus, it is possible to achieve a compact piezoelectric oscillator 80. Accordingly, since the first package 70 and the second package 60 can be formed to have almost the same shape with the same outer size, the positioning when the first package and the second package are superposed on and fixed to each other is facilitated.

The connection terminal portions 41*a*, 42*a*, 43*a*, and 44*a* exposed at the top surface of the second package 60 are positioned at the corner portions of the second package 60, other than the positions where the connection terminal portions of the first exemplary embodiment are formed.

Since the structure of the second package 60 is completely equal to the first exemplary embodiment except for the positions of the connection terminal portions 41*a*, 42*a*, 43*a*, and 44*a*, a method of forming the second package 60 using two lead frames will be described in detail. This construction can be used in the first exemplary embodiment as it is, only by changing the positions where the connection terminal portions are provided.

Figure 5:
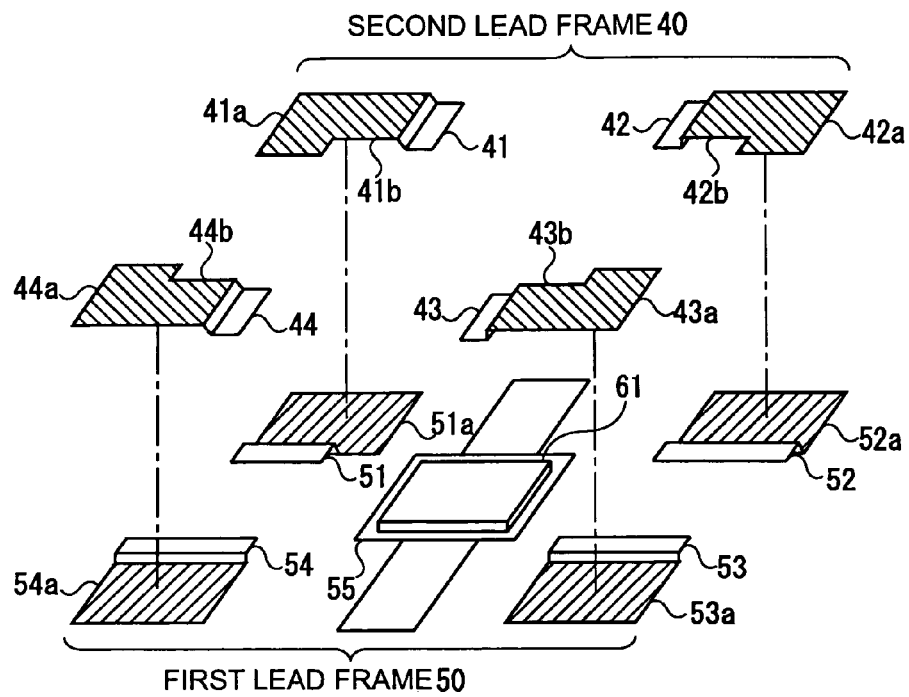
FIG. 5 is a schematic perspective view illustrating bent structures of a first lead frame and a second lead frame used in a second package of the piezoelectric oscillator shown in FIG. 3.
Figure 6:
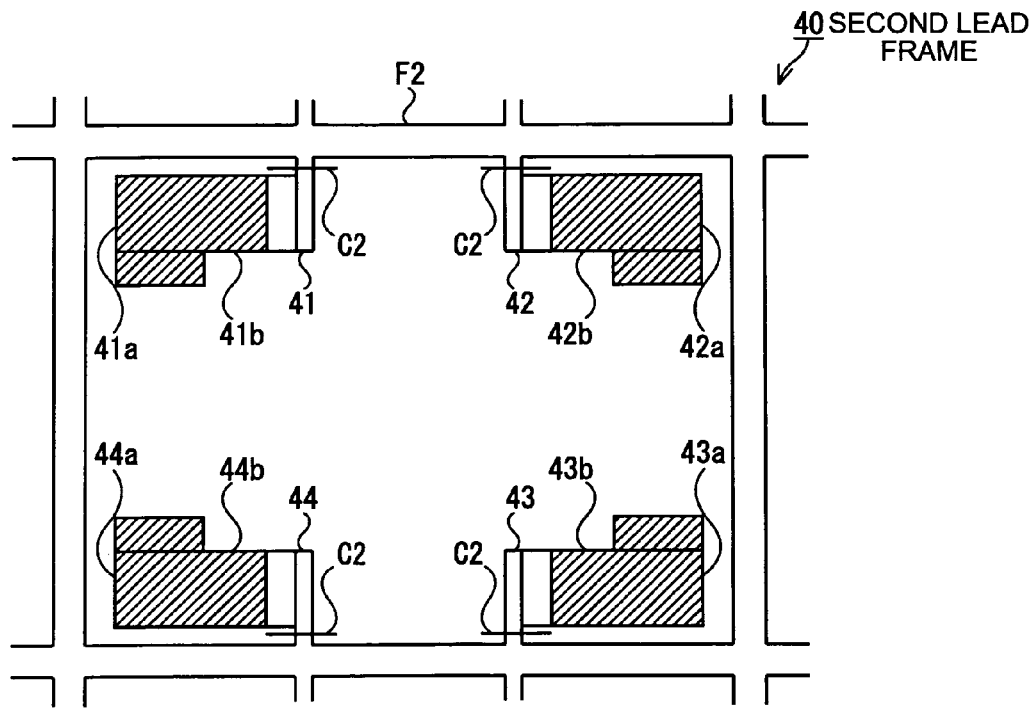
FIG. 6 is a schematic plan view illustrating an example of the second lead frame used in the second package of the piezoelectric oscillator shown in FIG. 3.
Figure 7:
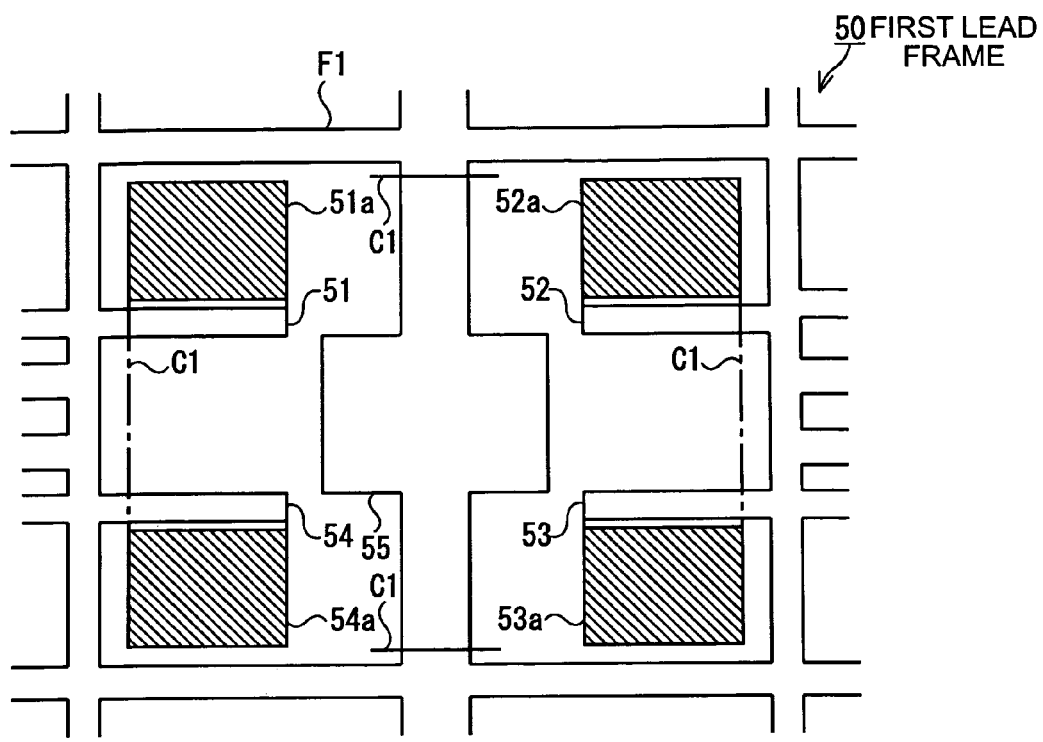
FIG. 7 is a schematic plan view illustrating an example of the first lead frame used in the second package of the piezoelectric oscillator shown in FIG. 3.

First, a structure of the lead frame to form the mounting portion of the oscillating circuit element or the terminal portions of the second package 60 will be described. FIG. 5 is a schematic perspective view illustrating a structure of the upper and lower positions of a first lead frame 50 and a second lead frame 40. FIGS. 6 and 7 are plan views of the first lead frame 50 and the second lead frame 40, respectively. In the present exemplary embodiment, for example, two lead frames of the first lead frame 50 and the second lead frame 40 are used. The first lead frame 50 and the second lead frame 40 are made of materials, such as Fe alloy including 42 alloy, an alloy of Cu—Sn, Cu—Fe, Cu—Zn, Cu—Ni, etc., Cu alloy, or three element alloy obtained by adding a third element to them, which are usual materials.

The first lead frame 50 of FIG. 7 is positioned at a lower level in the second package 60, as shown in FIG. 5.

FIG. 7 shows a state where the respective lead portions of the first lead frame 50 are connected to each other by a rectangular frame portion F1 surrounding them. The respective lead portions are cut at the positions of the respective cut lines C1 after bent in a predetermined shape and molded out of resin.

The first lead frame 50 includes a first lead portion 51, a second lead portion 52, a third lead portion 53, and a fourth lead portion 54, which are arranged substantially at four corners and have the same small rectangular shape. The element mounting portion 55 having a substantially rectangular shape is provided in the vicinity of the center thereof, and the element mounting portion 55 is connected to the frame portion F1.

The first lead portion 51, the second lead portion 52, the third lead portion 53, and the fourth lead portion 54 of the first lead frame 50 are bent such that end portions (hatched portions) 51*a*, 52*a*, 53*a*, and 54*a* having a relatively large area are positioned downward (in a direction receding from the first package 70 in FIG. 4) in FIG. 5. The end portions 51*a*, 52*a*, 53*a*, and 54*a* are shaped to be kept horizontal at positions lower than the remaining portions by one step. Further, portions having a narrow width other than the portions 51*a*, 52*a*, 53*a*, and 54*a* of the first lead portion 51, the second lead portion 52, the third lead portion 53, and the fourth lead portion 54 serve as inner terminals which are connected to the oscillating circuit element to be described later.

The second lead frame 40 of FIG. 6 is positioned at an upper level in the second package 60 as shown in FIG. 5.

FIG. 6 shows a state where the respective lead portions of the second lead frame 40 are connected to each other by a rectangular frame portion F2 surrounding them, and the respective lead portions are cut at positions of the respective cut lines C2 after bent in a predetermined shape and molded out of resin.

The second lead frame 40 includes a first lead portion 41, a second lead portion 42, a third lead portion 43, and a fourth lead portion 44, which are arranged almost at four corners and have the same small rectangular shape.

The first lead portion 41, the second lead portion 42, the third lead portion 43, and the fourth lead portion 44 of the second lead frame 40 are bent such that end portions (hatched portions) 41*a*, 42*a*, 43*a*, and 44*a* having a relatively large area are positioned upward (in a direction approaching the first package 70 in FIG. 4) in FIG. 5. The end portions 41*a*, 42*a*, 43*a*, and 44*a* are shaped to be kept horizontal at positions higher than the remaining portions by one step. Further, portions having a narrow width other than the portions 41*a*, 42*a*, 43*a*, and 44*a* of the first lead portion 41, the second lead portion 42, the third lead portion 43, and the fourth lead portion 44 serve as inner terminals which are connected to the oscillating circuit element to be described later.

Herein, the end portions 41*a*, 42*a*, 43*a*, and 44*a* are not limited to a complete rectangular shape, but may preferably have different shapes. For example, in the present exemplary embodiment, small cut-out portions 41*b*, 42*b*, 43*b*, and 44*b* are formed at the respective corner portions of the end portions 41*a*, 42*a*, 43*a*, and 44*a*.

As shown in FIG. 5, the oscillating circuit element 61 is fixed to the element mounting portion 55 of the first lead frame 50 by die bonding, etc. Electronic components, such as one or plural integrated circuits or capacitors are used as the oscillating circuit element 61. The oscillating circuit element 61 includes at least a predetermined circuit structure to excite the piezoelectric resonator element 32, and preferably includes a thermosensor (not shown) to detect temperature. In such a construction, a temperature compensated piezoelectric oscillator can be achieved.

Furthermore, in FIG. 5, the oscillating circuit element 61 fixed to the element mounting portion 55 is electrically connected to the inner terminals of the first lead portion 41, the second lead portion 42, the third lead portion 43, and the fourth lead portion 44 of the second lead frame 40 by the wire bonding using metal wires such as Au wires, as shown in FIG. 4.

Furthermore, the oscillating circuit element 61 is electrically connected to the inner terminals of the first lead portion 51, the second lead portion 52, the third lead portion 53, and the fourth lead portion 54 of the first lead frame 50 by the wire bonding using metal wires, such as Au wires as shown in FIG. 4.

In the second package 60, for the first and second lead frames 50 and 40 shown in FIGS. 6 and 7, the oscillating circuit element 61 is fixed and the wire bonding is performed, as shown in FIG. 4, and then an injection mold is performed by insulating synthetic resin, for example, epoxy resin 64. At that time, the portions 41*a*, 42*a*, 43*a*, and 44*a* bent upward in the second lead frame 40 are exposed at the top surface of the resin package. Further, the portions 51a, 52a, 53a, and 54a bent downward in the first lead frame 50 are exposed at the lower surface (bottom surface) of the resin package. Then, in the first and second lead frames 50 and 40 shown in FIGS. 6 and 7, the second packages 60 shown in FIGS. 3 and 4 are completed by cutting the frame portions F1 and F2 at the positions of the cut lines C1 and the cut lines C2, respectively.

In the second package 60 formed in this way, as shown in FIG. 3, the portions 41a, 42a, 43a, and 44a of the first to fourth lead portions 41, 42, 43, and 44 of the second lead frame 40 are exposed at the four corner portions of the top surface of the second package 60 to form second connection terminal portions.

The portions 51a, 52a, 53a, and 54a of the first to fourth lead portions 51, 52, 53, and 54 of the first lead frame 50 are exposed at the four corner portions of the lower surface (bottom surface) of the second package 60 to form first connection terminal portions. The first connection terminal portions are used as the mounting terminals when the piezoelectric oscillator 80 is mounted on a mounting substrate, etc.

As shown in FIGS. 3 and 4, the second connection terminal portions 41a, 42a, 43a, and 44a on the top surface of the second package 60 are adjacent to the external terminal portions 37 provided in the cut-out portions 71 at the four corners of the side surfaces of the first package 70 superposed on the second package.

Since the second package 60 is constructed in this way, as shown in FIGS. 4 and 5, connecting the second package 60 to the mounting substrate (not shown) on which the piezoelectric oscillator 80 is mounted and electrically connecting the second package 60 to the first package 70 can be provided by using two lead frames, such as the first lead frame 50 and the second lead frame 40, that is, by using separate lead frames.

For this reason, the mounting terminals (first connection terminal portions) 51a, 52a, 53a, and 54a, which connect the second package 60 to the mounting substrate (not shown) on which the piezoelectric oscillator 80 is mounted, and the second connection terminal portions 41a, 42a, 43a, and 44a, which electrically connect the second package 60 to the first package 70, can be formed at the positions vertically superposing each other, as shown in FIGS. 3 and 4. Therefore, for example, since end portions to be bent upward and downward need not be formed in one lead frame, the horizontal size of the required lead frame can be limited. Thus, it is possible to make the horizontal size of the piezoelectric oscillator 80 small.

As a result, it is possible to provide a piezoelectric oscillator capable of making an area required for the mounting small.

Figure 8:
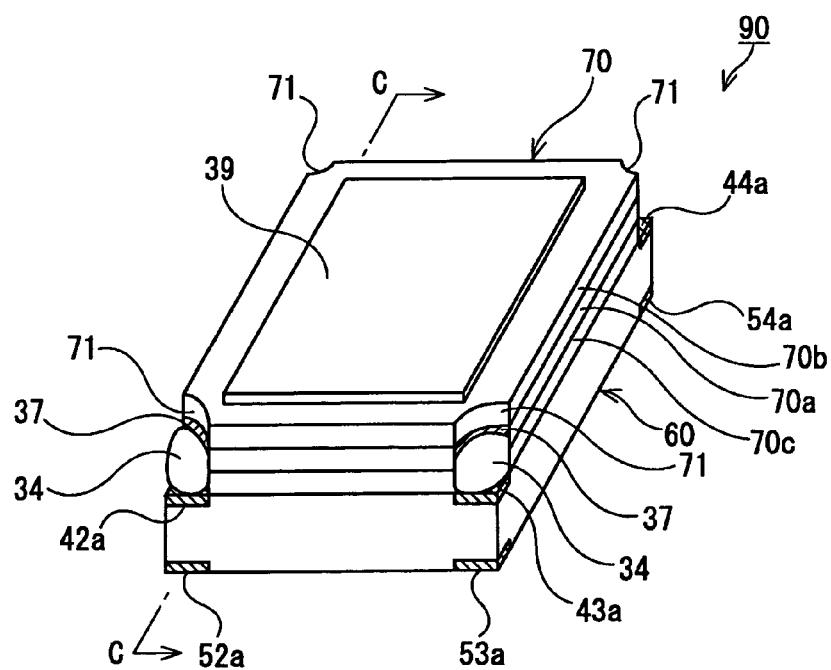
FIG. 8 is a schematic perspective view illustrating a modification of the piezoelectric oscillator shown in FIG. 3.
Figure 9:
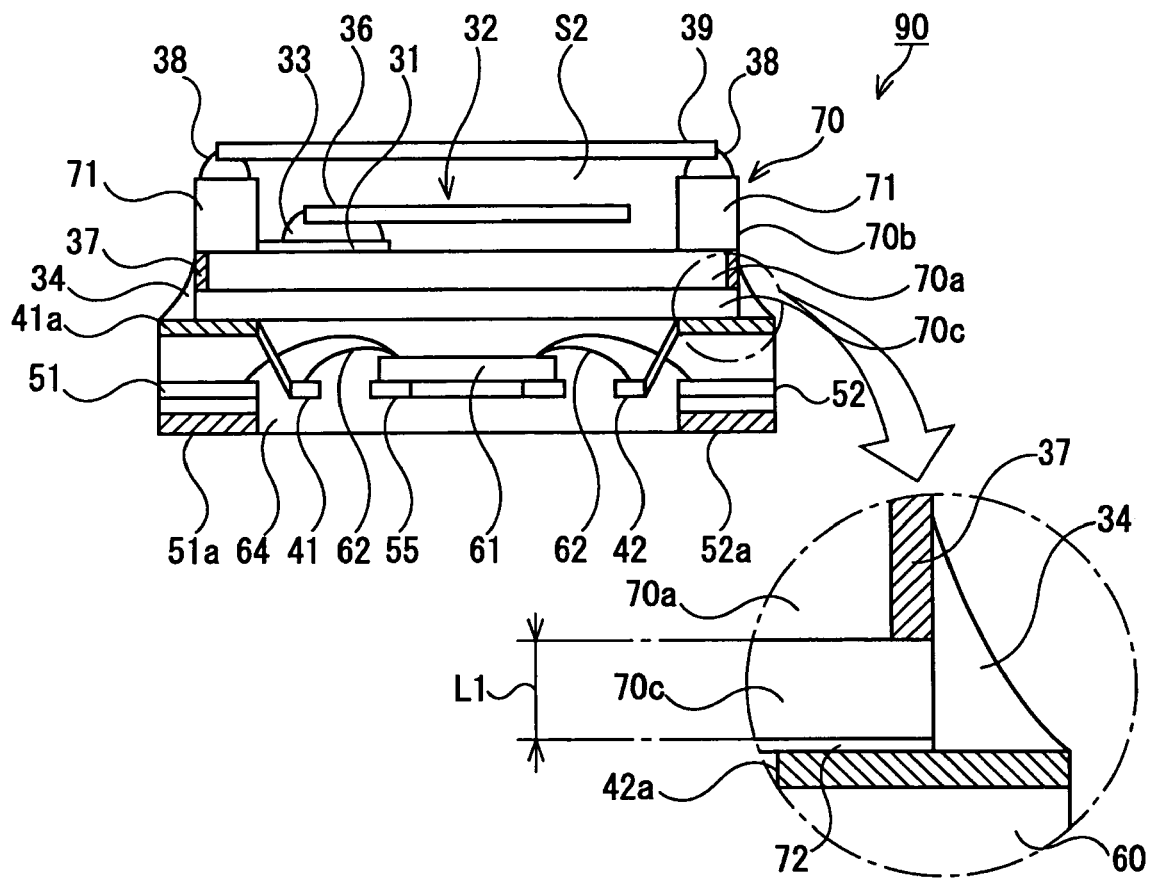
FIG. 9 is a schematic cross-sectional view taken along the plane C—C in the piezoelectric oscillator of FIG. 8.

FIGS. 8 and 9 illustrate a modification of the second exemplary embodiment of the piezoelectric oscillator according to the present invention, wherein FIG. 8 is a schematic perspective view thereof, and FIG. 9 is a schematic cross-sectional view taken along the plane C—C of FIG. 8. In these figures, since portions denoted by the same reference numerals as in FIGS. 3 and 4 are common thereto, the repeated description thereof will be omitted and differences will be mainly described.

In these figures, the piezoelectric oscillator 90 is similar to the second exemplary embodiment, except for the positions of the external terminal portions of the first package 70.

In the piezoelectric oscillator 90, for example, the first package 70 is formed by increasing the number of laminated substrates to add a lowermost substrate 70c and by superposing a substrate 70a and a substrate 70b thereon. As shown in FIG. 9, the cut-out portions 71 of the second substrate 70a from the bottom are provided with the external terminal portions 37, and the conductive material to form the external terminal portions 37 is not applied at a predetermined distance L1 corresponding to a thickness of the lowermost substrate 70c.

In this modification as constructed above, in addition to the operational advantages of the second exemplary embodiment, the following operational advantages can be obtained mainly.

Figure 10A:
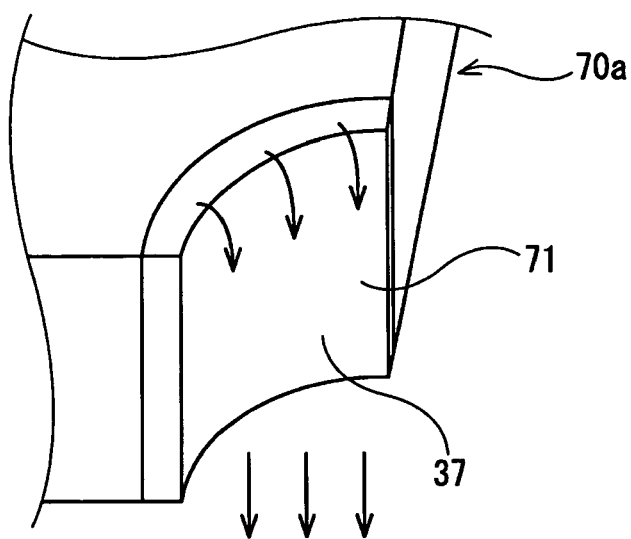
FIGS. 10(A) and 10(B) are views illustrating a state in which an external terminal portion of the first package of the piezoelectric oscillator shown in FIG. 8 is formed.

FIG. 10(A) is a view illustrating a method of providing the external terminal portion 31 in the cut-out portion 71 of the side surface of the first package 70.

In the figure, the external terminal portions 37 are formed by applying the conductive material in a paste state to the cut-out portions 71 of the second substrate 70a from the bottom and by enlarging the application surface of the conductive material to be the external terminal portions 37 using downward suction, for example, vacuum suction connected to a vacuum pump.

Figure 10B:
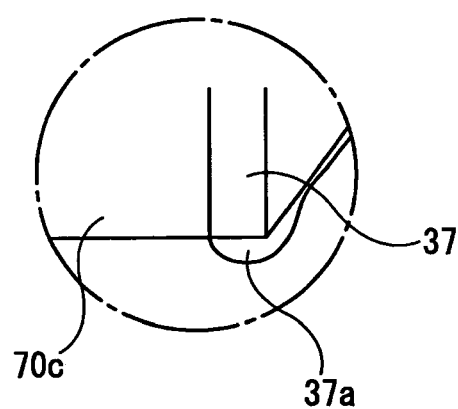

Therefore, if the area, in which the external terminal portions 37 are formed, is not limited to the cut-out portions 71 of the second substrate 70a from the bottom, for example, the area is formed up to the lowermost substrate 70c as shown in FIG. 10(B), the conductive material going down due to suction may go round into the bottom surface of the substrate 70c, thereby forming the cured portion like 37a.

Accordingly, as shown in the enlarged view of FIG. 9, when it is intended that the first package 70 and the second package 60 are fixed to each other by the adhesive 72, the cured conductive material 37a is interposed in the bonding surface thereof, and thus the bonding posture of the first package 70 is inclined. Therefore, it is possible to reduce or prevent the conductive material from going round into the bonding surface by forming the area of L1, where the external terminal portions 37 are not provided, at the lower end portion of the first package 70. Thus, it is possible to accurately fix the first package 70 to the second package 60.

As a result, in the side surfaces of the first package 70, portions, where the package material is exposed in a range of L1, are formed below the external terminal portions 37. For this reason, when the external terminal portions 37 of the first package 70 and the connection terminal portions 42a of the second package 60 are electrically connected to each other by, for example, the silicon based conductive adhesive 34, the portions, in which the package is exposed, and the conductive adhesive 34 are intensively coupled to each other, thereby intensifying the electrical and mechanical connection structure since the outer surface of the package made of ceramics, etc. having a rough surface has a bonding force larger than the gold plating constituting the surfaces of the external terminal portions 37.

FIG. 11 is a schematic plan view illustrating various shapes of the first package 70.

Figure 11A:
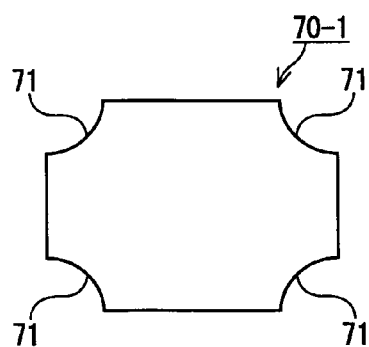
FIGS. 11(A)–11(D) are schematic plan views illustrating various shapes of the first package of the piezoelectric oscillator shown in FIG. 8.

The first package 70-1 of FIG. 11(A) has almost the same shape as the first package 70 of FIG. 8, and the corner portions thereof are provided with the cut-out portions 71 having a quarter circle shape.

Figure 11B:
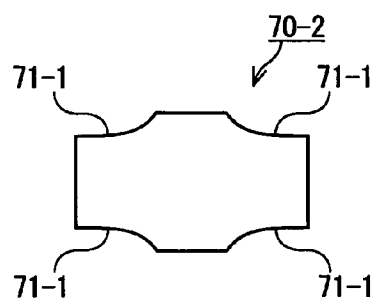

In the first package 70-2 of FIG. 11(B), the corner portions thereof are provided with the cut-out portions 71-1 having a quarter ellipse shape.

Figure 11C:
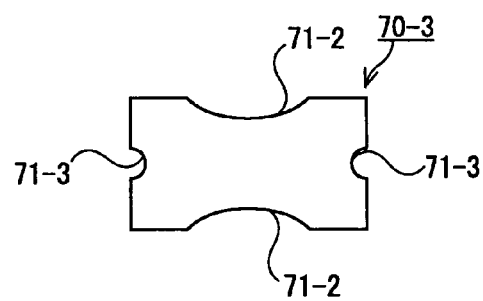

In the first package 70-3 of FIG. 11(C), the material-removed portions 71-2, 71-2 and 71-3, 71-3 having a concave shape are provided in the vicinity of the centers of the sides of the package having a rectangular shape.

Figure 11D:
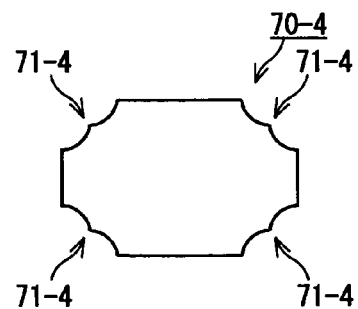

In the first package 70-4 of FIG. 11(D), the corner portions are provided with the cut-out portions 71-4 in which a plurality of curved surfaces is successively formed.

As described above, the material-removed portions provided in the peripheral edge portion of the first package 70 may have various shapes, and they can all exhibit the operational advantages of the second exemplary embodiment.

Figure 12:
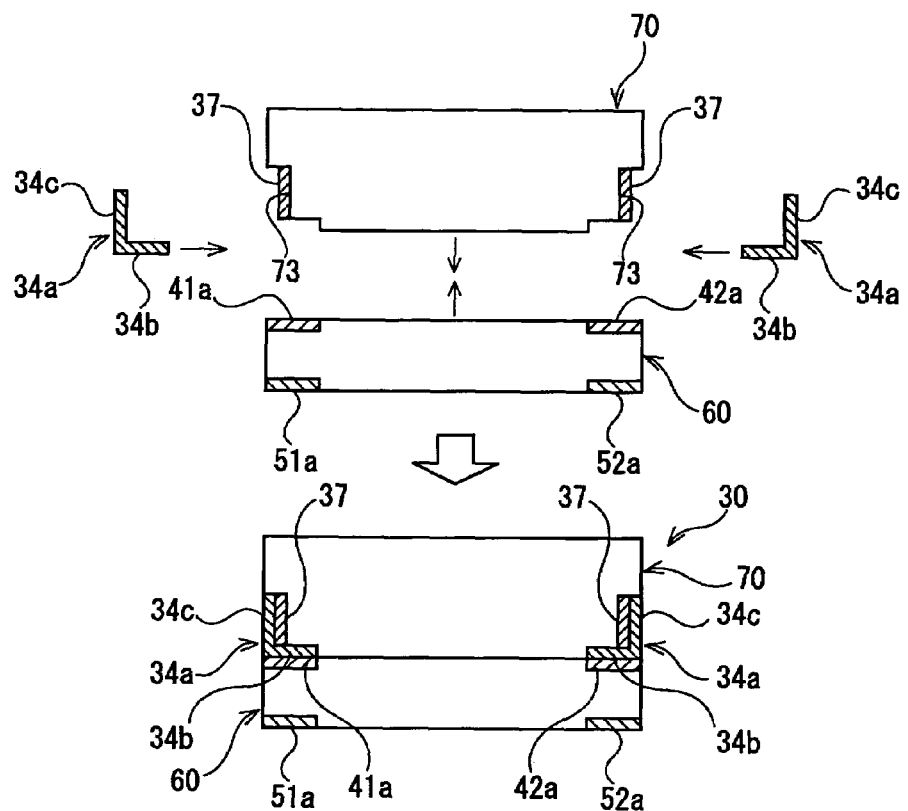
FIG. 12 is an explanatory view illustrating an example of a method of electrically connecting the first package with the second package in the exemplary embodiments of the piezoelectric oscillator according to the present invention.

FIG. 12 illustrates an example of a method of electrically connecting the first package 70 to the second package 60.

In the figure, this connection structure uses the conductive material 34a having an "L" shaped cross-section. That is, in the first package 70, the concave portions 73 corresponding to at least a thickness of the conductive material 34a are formed in the side surfaces thereof, and the external terminal portions 37 are formed in the inner side. The conductive materials 34a are formed of, for example, solder, preferably solder made of an alloy not containing lead to have an "L" shaped cross-section as shown in the figure. The horizontal portions 34b of the conductive materials 34a having the L shape are positioned on the bottom surface of the first package 70, and the vertical portions 34c are inserted into the concave portions 73 of the first package 70.

In such a state, as shown in the lower side of FIG. 12, the first package 70 and the second package 60 can be electrically connected to each other to form the piezoelectric oscillator 80 by superposing and fixing the first package 70 on the second package 60 and by heating them in a reflow furnace.

According to this method, the vertical portions 34c of the conductive materials 34a having the L shape cross-section can be positioned at the external terminal portions 37 of the first package 70, and the horizontal portions 34b of the conductive materials 34a can be positioned at the connection terminal portions 41a and 42a of the second package 60 only by inserting the conductive materials into the concave portions 73 of the first package 70. Thus, it is possible to more easily bond the first package 70 to the second package 60.

Figure 13:
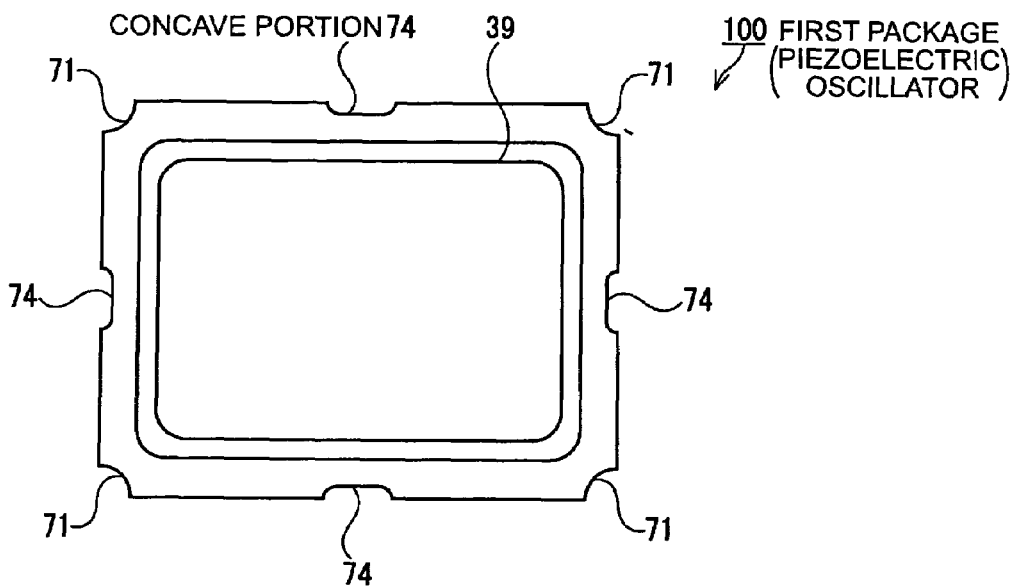
FIG. 13 is a schematic plan view of a modification of the first package which can be applied to the exemplary embodiments of the piezoelectric oscillator according to the present invention.
Figure 14:
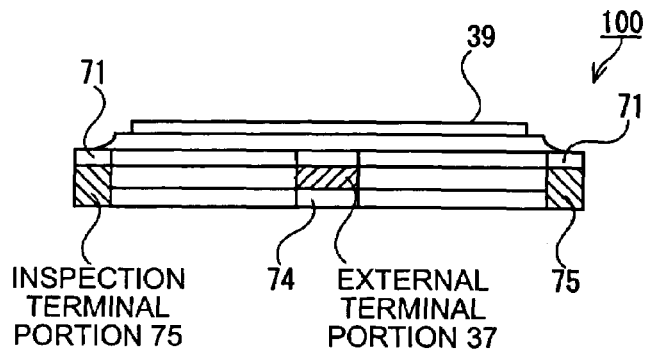
FIG. 14 is a schematic side view of a modification of the first package which can be applied to the exemplary embodiments of the piezoelectric oscillator according to the present invention.
Figure 15:
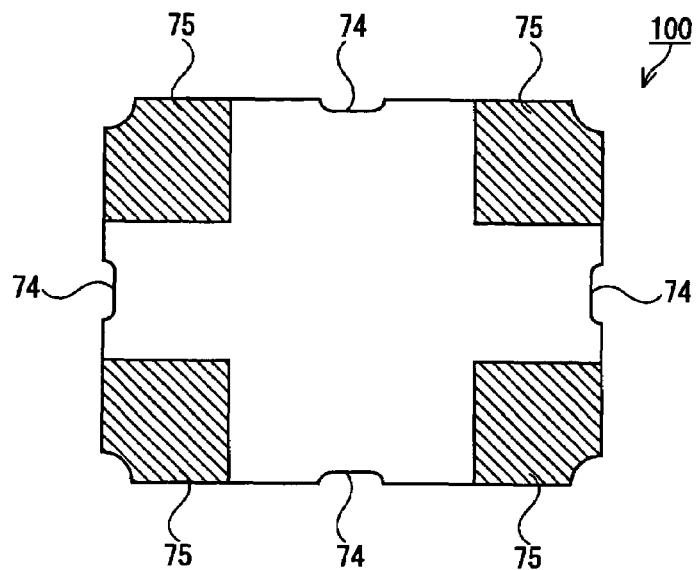
FIG. 15 is a schematic bottom view of a modification of the first package which can be applied to the exemplary embodiments of the piezoelectric oscillator according to the present invention.

FIGS. 13 to 15 illustrate modifications of the first package.

FIG. 13 is a schematic plan view of the first package 100. FIG. 14 is a schematic side view of the first package 100. FIG. 15 is a schematic bottom view of the first package 100. Although these figures show an outer structure of the first package 100, the inner structure thereof is similar to the description explained with reference to FIGS. 1 and 2.

By forming the first package to have the following construction, the first package 100 can be used as the first package to form the piezoelectric oscillator and in addition, can be used independently as a piezoelectric oscillator.

As shown in FIGS. 13 to 15, the cut-out portions 71, which are the material-removed portions, are formed in the corner portions of the first package 100. The concave portions 74, as the material-removed portions, are provided in the vicinity of the centers of the respective sides of the first package 100 having a rectangular shape.

The electrode portions formed of conductive patterns are formed in the respective cut-out portions 71, and the electrode portions are used as the inspection terminal portions 75 (see FIG. 14).

The inspection terminal portions have the same structure as the external terminal portions described in the first and second exemplary embodiments and are connected to the excitation electrodes of the built-in piezoelectric resonator element. The inspection terminal portions are different from the external terminal portions in their forming positions and use. The inspection terminal portions are formed, for example, in the cut-out portions 71. Furthermore, as shown in FIG. 15, the inspection terminal portions extend integrally to the corners of the bottom surface of the first package 100 as the inspection terminal portions 75 and are exposed at the package.

On the contrary, the external terminal portions 37 of the first package 100 are formed in the concave portions 74 provided in the side surfaces of the side centers of the rectangular package, respectively. At least two external terminal portions 37 are required, and in this example, four are formed.

As shown in FIG. 14, the external terminal portions 37 are separated from the lower end of the first package 100 by a predetermined gap and can exhibit the same operation as described with reference to FIGS. 9 and 10.

In the first package 100 constructed as described above, the inspection terminal portions 75 can be used for the inspection of operation after completion through the areas formed in the respective cut-out portions 71 and/or in the package bottom.

By using the inspection terminal portions 75 formed in the bottom surface of the first package 100 as the mounting terminals to the mounting substrate, the first package can be independently used as the piezoelectric oscillator.

The piezoelectric oscillator can be formed by superposing the first package on the second package (not shown) having the same shape as the first package 100 and provided on the centers of the respective sides of a rectangular shape with the connection terminal portions like the second package 60 shown in FIG. 1, by electrically connecting the connection terminal portions to the external terminal portions 37, and by fixing the first package to the second package having the same shape as the first package 100.

Therefore, in the first package 100, the mounting terminals (corresponding to the inspection terminal portions 75 at four corners of the bottom surface in FIG. 15) used for the independent piezoelectric oscillator and the external terminal portions 37 can be arranged at different positions. Further, the external terminal portions 37 are separated from the lower end by a predetermined gap. Thus, when the first package 100 is independently used as the piezoelectric oscillator, the inspection terminal portions 75 and the external terminal portions 37 are arranged at different positions insulated from each other and adjacent to each other, and thus the inspection terminal portions 75 and the external terminal portions 37 are not short-circuited due to the solder in mounting.

Operational advantages are the same as the piezoelectric oscillator of the first or second exemplary embodiments.

Figure 16:
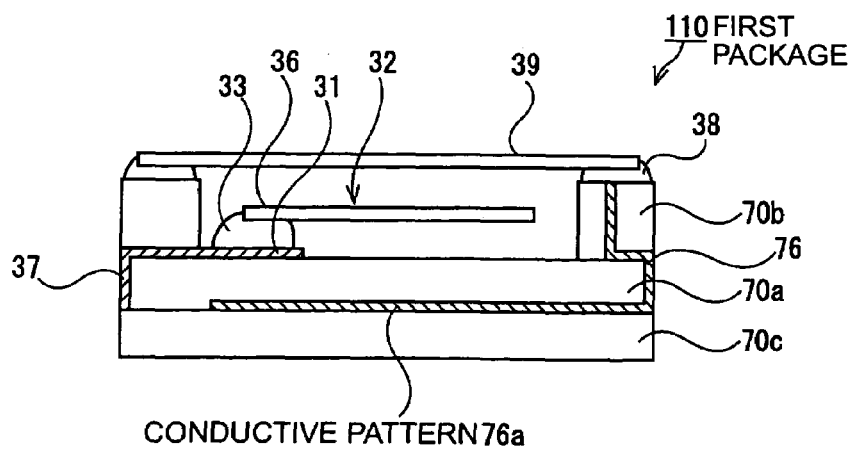
FIG. 16 is a schematic cross-sectional view of another modification of the first package which can be applied to the exemplary embodiments of the piezoelectric oscillator according to the present invention.

FIG. 16 is a schematic cross-sectional view illustrating another modification of the first package. In the figure, since portions denoted by the same reference numerals as in FIGS. 8 and 9 are common thereto, the repeated description thereof will be omitted and differences will be mainly described.

In the first package 110, the conductive patterns 76a is provided between the lowermost substrate 70c and the substrate 70a laminated thereon, that is, in the inner layer of the package. The conductive pattern 76a is connected integrally to the cover 39, thereby forming an earth electrode 76 as a whole.

In this case, the cover 39 is made of conductive metal, such as Fe—Ni—Co alloy, and the solder member 38 employs the same metal or the conductive adhesive.

As a result, a shield structure can be achieved by making the conductive pattern 76a in the inner layer of the first package 110 have the same potential as the cover 39.

Figure 17:
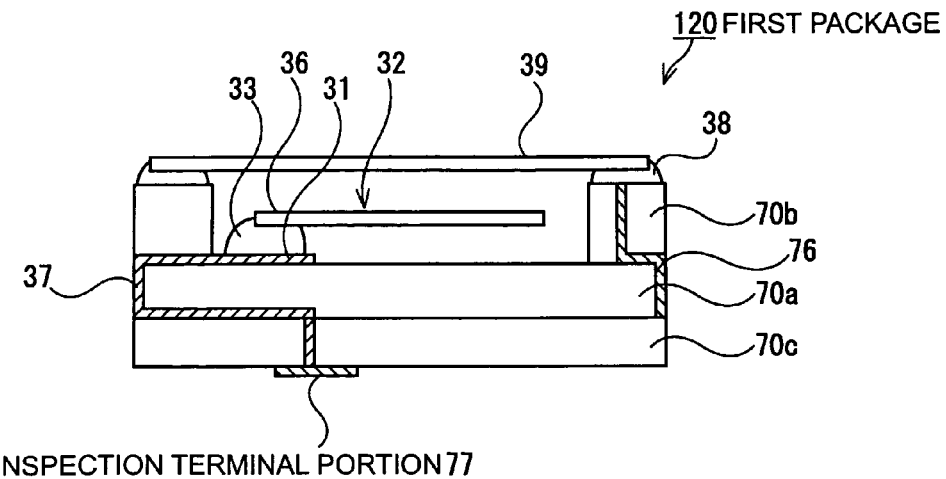
FIG. 17 is a schematic cross-sectional view of still another modification of the first package which can be applied to the exemplary embodiments of the piezoelectric oscillator according to the present invention.

FIG. 17 is a schematic cross-sectional view illustrating another modification of the first package. In the figure, since portions denoted by the same reference numerals as in FIGS. 8, 9 and 16 are common thereto, the repeated description thereof will be omitted and differences will be mainly described.

As compared with the modification shown in FIG. 16, in the first package 120, the external terminal portions 37 extend to the bottom surface of the lowermost substrate 70c to form the inspection terminal portions 77.

Accordingly, since connection pins can come in contact with the inspection terminal portions 77 from the bottom surface at the time of inspection, the inspection is facilitated.

In FIG. 17, the conductive patterns are omitted for the purpose of the convenience of illustration.

Figure 18:
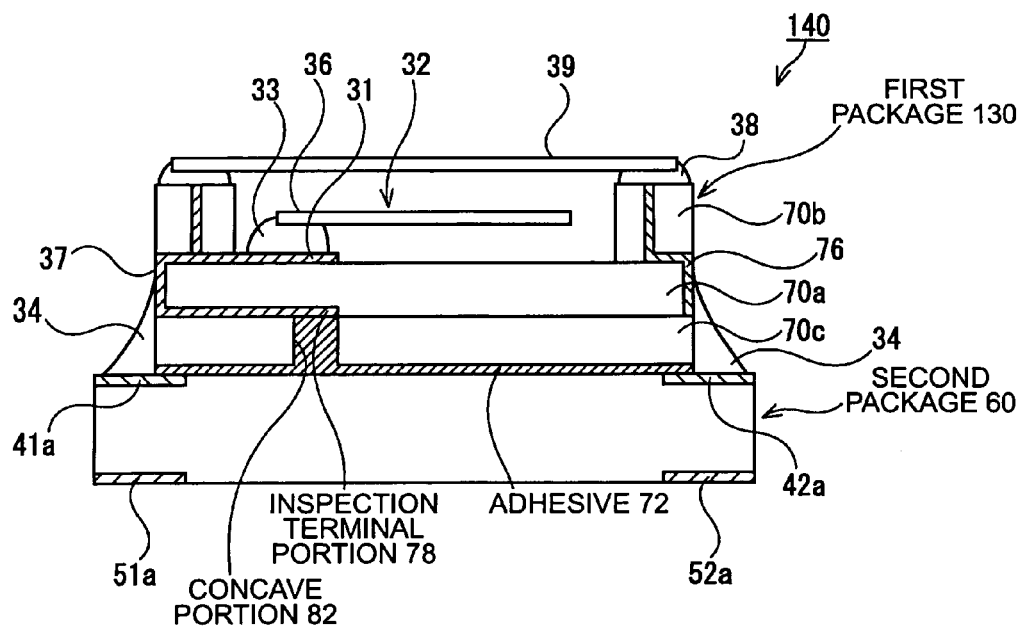
FIG. 18 is a schematic cross-sectional view illustrating a third exemplary embodiment of the piezoelectric oscillator according to the present invention.

FIG. 18 is a schematic cross-sectional view illustrating a third exemplary embodiment of the piezoelectric oscillator according to the present invention. In FIG. 3, since portions denoted by the same reference numerals as in the first and second exemplary embodiments and the modifications thereof are common thereto, the repeated description thereof will be omitted and differences will be mainly described.

In the piezoelectric oscillator 140, the second package 60 has the same construction as the first exemplary embodiment. The first package 130 is similar to the first package 120 of FIG. 17 except for the following differences.

That is, in the first package 130, opened concave portions 82 are provided in the package bottom by providing through holes in the lowermost substrate 70c. Preferably, the inspection terminal portions 78 are exposed at the concave portions 82.

That is, the first package 130 is characterized in that the concave portions 82 are formed in the bottom surface thereof and the inspection terminal portions 78 are provided therein.

Accordingly, as shown in the figure, when it is intended to superpose the first package 130 on the second package 60 and to fix them using adhesive 72, the adhesive 72 is filled into the concave portions 82 of the first package 130. Therefore, the application area of the adhesive 72 increases, and thus the bonding power can be enhanced. Furthermore, since the adhesive is filled into the concave portions 82, a thickness of the adhesive between the first and second packages becomes thinner, thereby making a thickness of the piezoelectric oscillator thinner.

Figure 19:
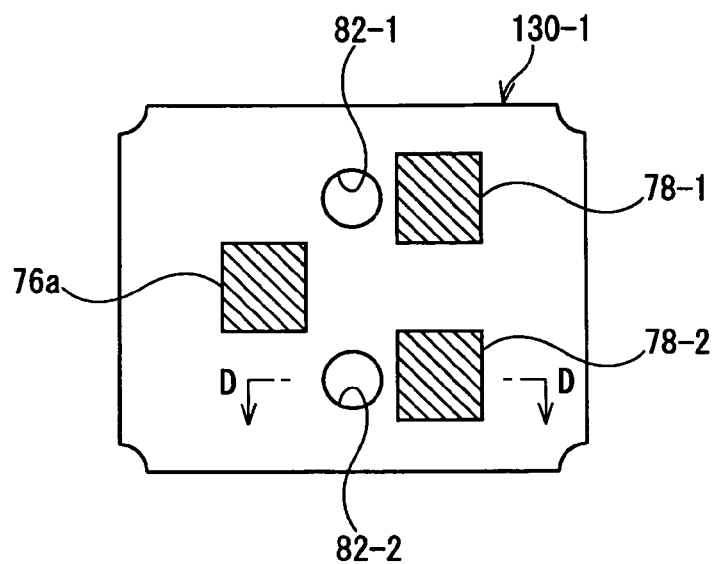
FIG. 19 is a schematic bottom view of a modification of the first package of the piezoelectric oscillator shown in FIG. 18.
Figure 20:
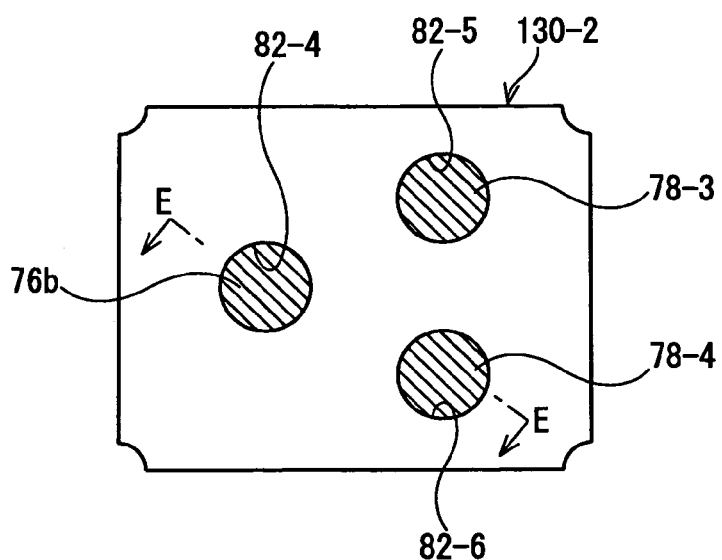
FIG. 20 is a schematic bottom view of a modification of the first package of the piezoelectric oscillator shown in FIG. 18.
Figure 21:
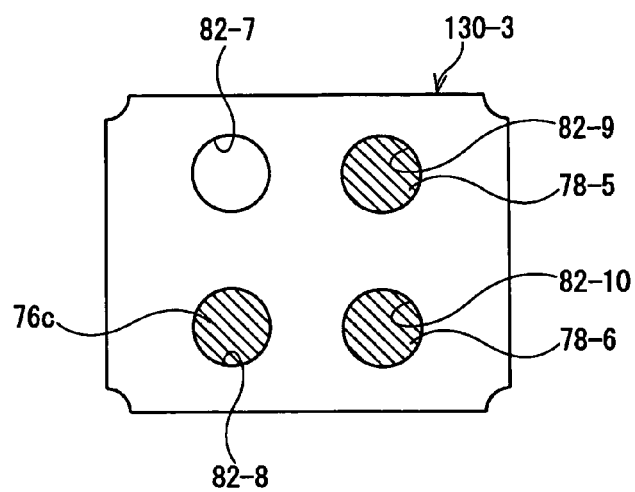
FIG. 21 is a schematic bottom view of a modification of the first package of the piezoelectric oscillator shown in FIG. 18.
Figure 22:
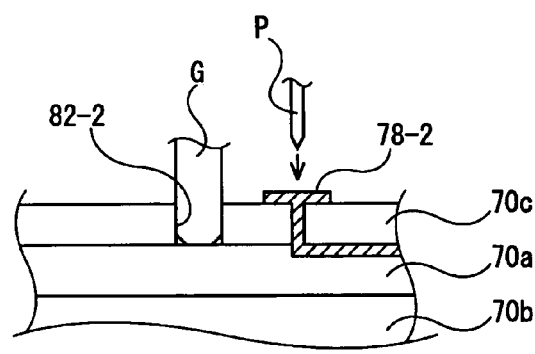
FIG. 22 is a cross-sectional view taken along the plane D—D of FIG. 19.
Figure 23:
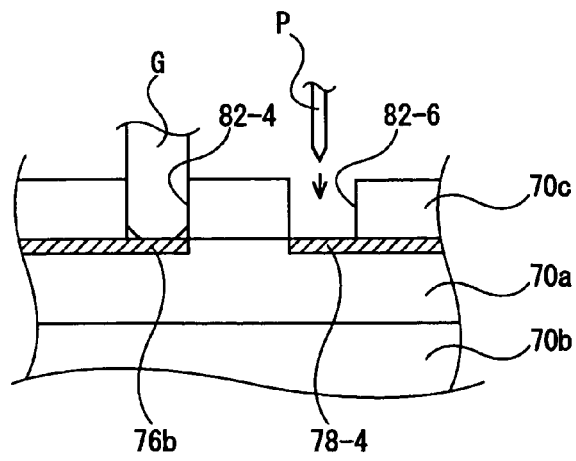
FIG. 23 is a cross-sectional view taken along the plane E—E of FIG. 20.
Figure 24:
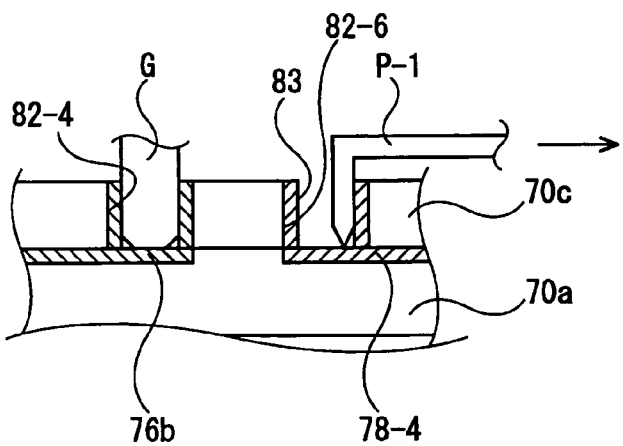
FIG. 24 is a partial cross-sectional view schematically illustrating a modification of the first package of the piezoelectric oscillator of FIG. 18.

FIGS. 19 to 21 illustrate modifications of the third exemplary embodiment, wherein the respective figures are views illustrating the bottom surface of the first package. With respect to these figures, FIG. 22 is a cross-sectional view taken along the plane D—D of FIG. 19, FIG. 23 is a cross-sectional view taken along the plane E—E of FIG. 20, and FIG. 24 is a view illustrating a modification of FIG. 23.

In FIG. 19, the bottom surface of the first package 130-1 is provided with the earth terminal 76a connected to the earth electrode 76 (see FIG. 18). In addition, the bottom surface of the first package 130-1 is provided with the concave portions 82-1 and 82-2, and the inspection terminal portions 78-1 and 78-2 are formed adjacent to the concave portions 82-1 and 82-2. A gap between the concave portion 82-1 and the inspection terminal portion 78-1, and a gap between the concave portion 82-2 and the inspection terminal portion 78-2 are set to be equal to each other.

The earth terminal 76a is used to confirm that the inspection terminal portions 78-1 and 78-2 are not grounded after forming the first package 130-1. Then, the performance inspection is performed as shown in FIG. 22. That is, a guide boss G of an inspecting jig and an inspecting pin P communicating with the guide boss G are used.

A distance between the inspecting pin P and the guide boss G is fixed, and the distance is previously set to be equal to the gap between the concave portion 82-1 and the inspection terminal portion 78-1 and the gap between the concave portion 82-2 and the inspection terminal portion 78-2. Accordingly, when the guide boss G having an outer diameter slightly smaller than an inner diameter of the concave portion 82-2 is inserted into the concave portion, and then the inspecting pin P is moved. Next, the inspecting pin P is automatically guided to accurately come in contact with the inspection terminal portion 78-2. As a result, the test procedure at the time of a performance test can be easily performed.

In FIG. 20, in the bottom surface of the first package 130-2, the earth terminal 76b connected to the earth electrode 76 is provided in the inside of the concave portion 82-4 (see FIG. 18). Furthermore, the bottom surface of the first package 130-2 is provided with the concave portions 82-5 and 82-6 at positions spaced from the concave portion 82-4 by the same distance, and the inspection terminal portions 78-3 and 78-4 are formed in the insides of the concave portions 82-5 and 82-6.

Accordingly, the positions of the guide boss G and the two inspecting pins P in contact with the inspection terminal portions 78-3 and 78-4 are fixed. Then, when the guide boss G is inserted into the concave portion 82-4 and then the two inspecting pins P are moved as shown in FIG. 23, the inspecting pins P are automatically guided to accurately come in contact with the inspection terminal portions 78-3 and 78-4. As a result, even in a case of modifications, the inspection procedure at the time of a performance test can be easily performed. The guide boss G itself can be used as an inspecting pin to confirm that the inspection terminal portions 78-1 are not connected to the ground.

In FIG. 21, in the bottom surface of the first package 130-3, the concave portions 82-7, 82-8, 82-9, and 82-10 are formed at positions corresponding to the vertexes of a square shape, respectively. A terminal portion is not formed in the concave portion 82-7. The concave portion 82-8 is provided with the earth terminal 76c. The concave portions 82-9 and 82-10 are provided with the inspection terminal portions 78-5 and 78-6, respectively.

Therefore, the positional accuracy of the inspecting pins is enhanced by inserting the guide boss G into all the concave portions. Furthermore, since the inspection terminal portions are arranged in the concave portions, the electrical connection to the inspecting pins is surely secured.

In this case, the number of concave portions formed in the bottom surface of the first package 130-3 increases. However, for the same reasons as described with reference to FIG. 18, the bonding power between the first package and the second package can be enhanced as much.

FIG. 24 illustrates still another modification of the construction of FIG. 23.

In this case, a front end of the inspecting pin P-1 is bent in an "L" shape or a key shape and can be moved, for example, in the arrow direction.

On the other hand, the inner surfaces of the concave portions, specifically, the inner surface of the concave portion 82-6 is provided with a conductive pattern 83 formed integrally together with the inspection terminal portion 78-4. Accordingly, since the inspecting pin P-1 can come in contact with the conductive pattern 83 formed integrally together with the inspection terminal portion 78-4 at its side surface, the electrical connection can be accomplished accurately as much.

In this case, the concave portion 82-4 and the guide boss G may be omitted. That is, when the inspecting pin P-1 is inserted into the concave portion 82-6 and then moved in the arrow direction, the inspecting pin can come in contact with the conductive pattern 83 formed integrally together with the inspection terminal portion 78-4. Thus, it is possible to simplify the construction of the inspecting jig.

Figure 25:
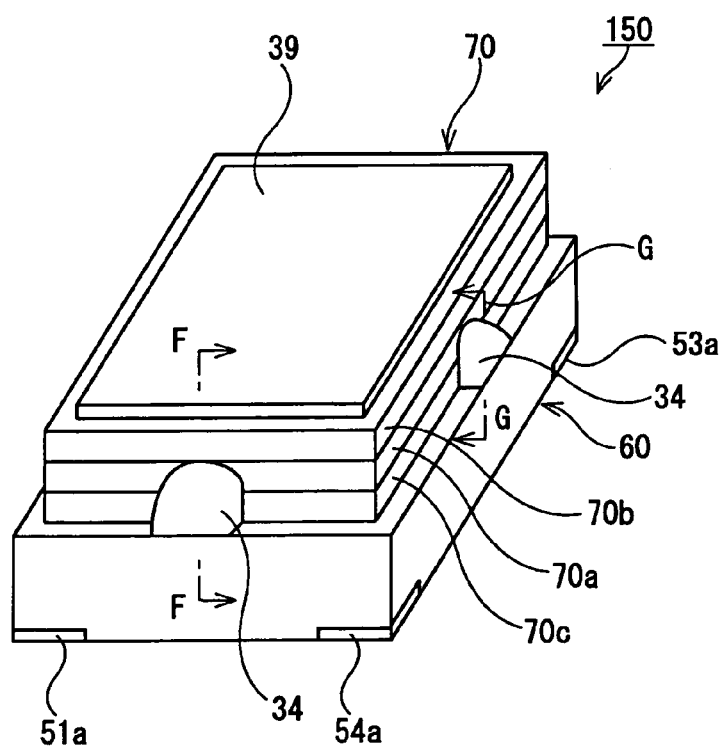
FIG. 25 is a schematic perspective view of the piezoelectric oscillator associated with a modification of an electrical connection structure of the first package and the second package.
Figure 26:
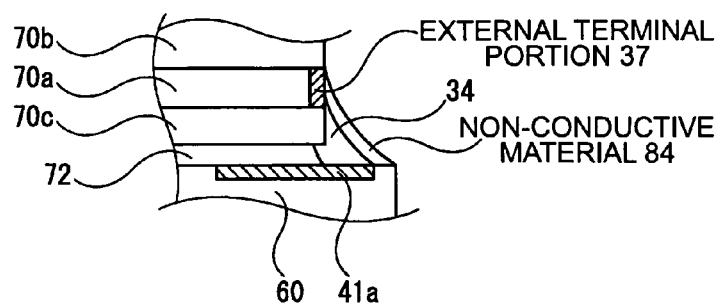
FIG. 26 is a cross-sectional view taken along the plane F—F of FIG. 25.
Figure 27:
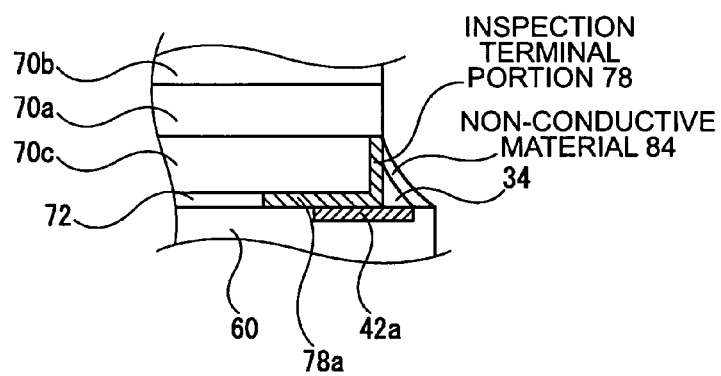
FIG. 27 is a cross-sectional view taken along the plane G—G of FIG. 25.

FIGS. 25 to 27 are views illustrating a modification of the electrical connection structure between the first package and the second package.

FIG. 25 is a schematic perspective view of the piezoelectric oscillator 150, FIG. 26 is a cross-sectional view taken along the plane F—F of FIG. 25, and FIG. 27 is a cross-sectional view taken along the plane G—G of FIG. 25.

The piezoelectric oscillator 150 of FIG. 25 has the same structure as the first exemplary embodiment except for the electrical connection structure between the first package and the second package. Portions common thereto are denoted by the same reference numerals, and the repeated description will be omitted.

As shown in FIG. 26, the external terminal portions 37 are formed in the side surfaces of the second substrate 70a from the bottom and are separated from the lower end of the first package 70 by a predetermined gap corresponding to the thickness of the substrate 70c.

The external terminal portions 37 and the connection terminal portions 41a of the second package 60 are connected to each other by the conductive material, preferably by the conductive adhesive 34.

The connection structure is coated with the insulating non-conductive material 84 to cover the conductive adhesive 34. For example, a non-conductive adhesive can be suitably used as the insulating non-conductive material 84, and specifically, for example, the epoxy based or silicon based adhesive can be used as the insulating non-conductive material 84.

As shown in FIG. 27, the inspection terminal portions 78 are formed in the side surfaces of the lowermost substrate 70c and have the portions 78a curving into the bottom surface of the first package 70. That is, the performance test of the first package 70 can be independently performed using the portions 78a of the inspection terminal portions 78, and when the first package is superposed on the second package 60 after the inspection, the portions 78a of the inspection terminal portions 78 are hidden.

By electrically connecting the inspection terminal portions to the connection terminal portions 42a of the second package 60 using the portions formed in the side surfaces of the lowermost substrate 70c, the inspection terminal portions 78 are used in common to the external terminal portions.

The inspection terminal portions 78 and the connection terminal portions 42a of the second package 60 are connected to each other by a conductive material, preferably by the conductive adhesive 34.

According to this piezoelectric oscillator 150, after electrically connecting the first package 70 to the second package 60 as described above, the conductive portions are not exposed externally by the insulating non-conductive material 84. Therefore, it is possible to effectively reduce or prevent the variation of the oscillation frequency due to the attachment of foreign substances, such as solder or flux material, to the conductive portions other than the grounded cover.

Figure 28:
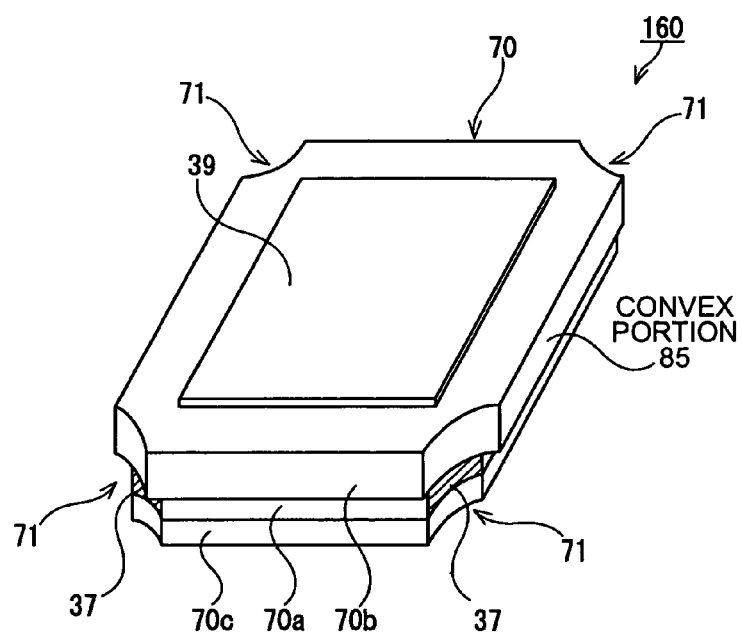
FIG. 28 is a schematic perspective view of the first package illustrating another modification of the first package which can be used in the piezoelectric oscillator of FIG. 8.
Figure 29:
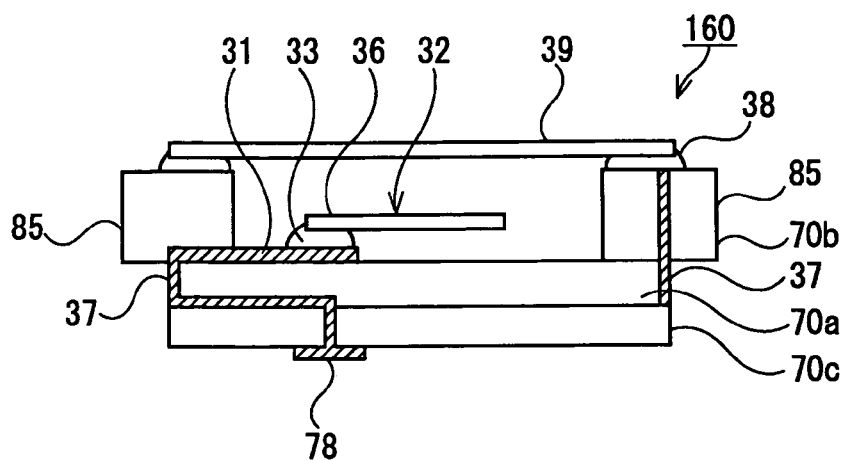
FIG. 29 is a schematic cross-sectional view of the first package illustrating another modification of the first package which can be used in the piezoelectric oscillator of FIG. 8.
Figure 30:
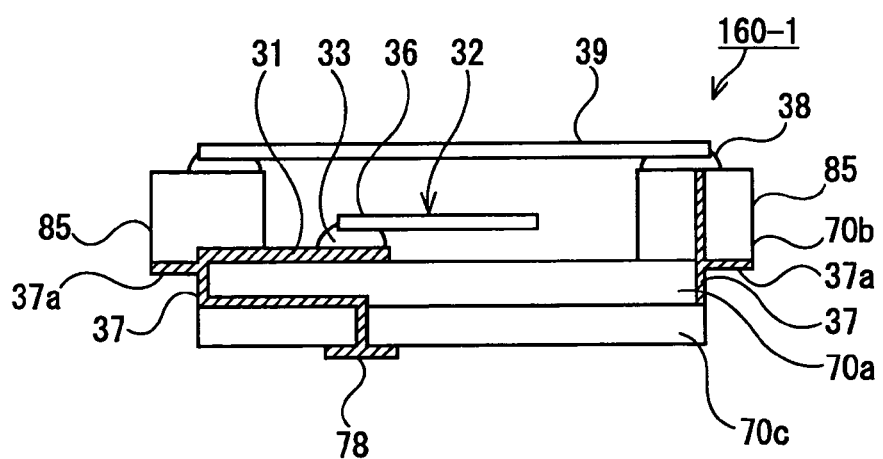
FIG. 30 is a schematic cross-sectional view of the first package illustrating still another modification of the first package which can be used in the piezoelectric oscillator of FIG. 8.

FIGS. 28 to 30 illustrate another modification of the first package which can be used in the piezoelectric oscillator 90 of FIG. 8.

FIG. 28 is a schematic perspective view of the first package, FIG. 29 is a schematic cross-sectional view of the first package of FIG. 28, and FIG. 30 is a schematic cross-sectional view illustrating still another modification of the first package which can be used in the piezoelectric oscillator 90 of FIG. 8.

In the construction of the first package, portions common to other exemplary embodiments and modifications are denoted by the same reference numerals, and the repeated description will be omitted.

As shown in FIGS. 28 and 29, in this modification, the first package 70 is formed by laminating three substrates 70c, 70a, and 70b from the bottom. By making the outer size of the substrate 70b larger than the other substrates, an area adjacent to the cover 39 in the external terminal portions 37 are formed into a convex portion 85. The convex portion 85 is formed in a flange shape, for example, by making the outer size of the substrate 70b larger.

As a result, the following operational advantages are exhibited. That is, when the electrical connection to the second package 60 side is performed by applying a conductive material, such as the conductive adhesive described with reference to FIG. 26 to the external terminal portions 37, the cover 39 and the piezoelectric resonator element are electrically connected to each other, and thus the frequency of the piezoelectric oscillator may be varied if the melted conductive material flows to come in contact with the metal cover 39. Therefore, for example, it is possible to reduce or prevent the conductive material from flowing toward the cover by making a part of the first package 70 a shade shape using the convex portion 85.

Furthermore, as shown in FIG. 30, when the conductive patterns 37a formed integrally together with the external terminal portions 37 are formed in the areas adjacent to the external terminal portions 37 in the convex portion 85, it is possible to enlarge the areas of the side surfaces of the first package 70, in which the conductive material to connect to the second package 60 side is melted and diffused, so that the electrical connection structure can be more surely implemented.

Figure 31:
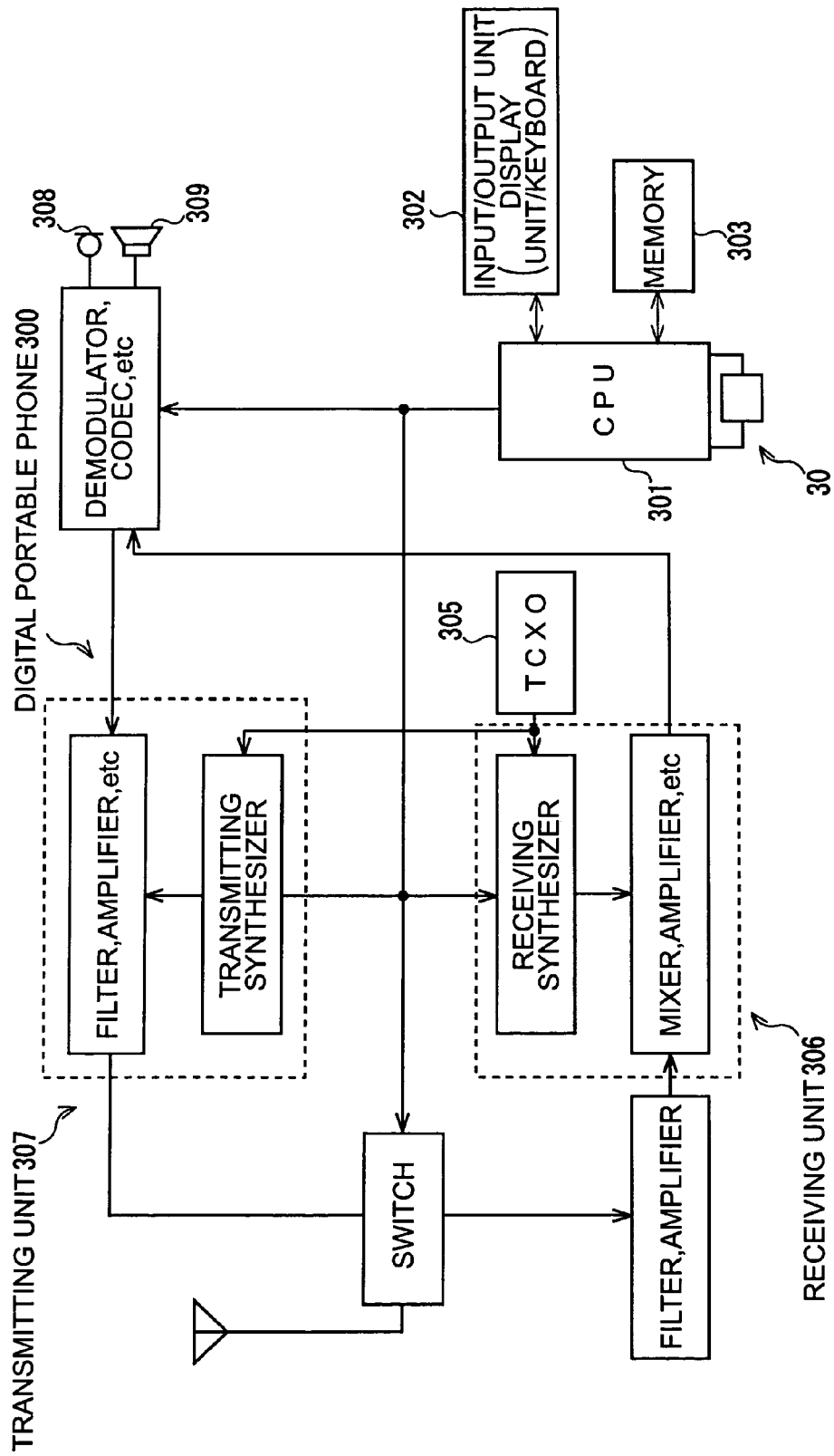
FIG. 31 is a view illustrating schematic construction of a digital portable phone as an example of an electronic apparatus employing the piezoelectric oscillator according to the exemplary embodiments of the present invention.
Figure 32:
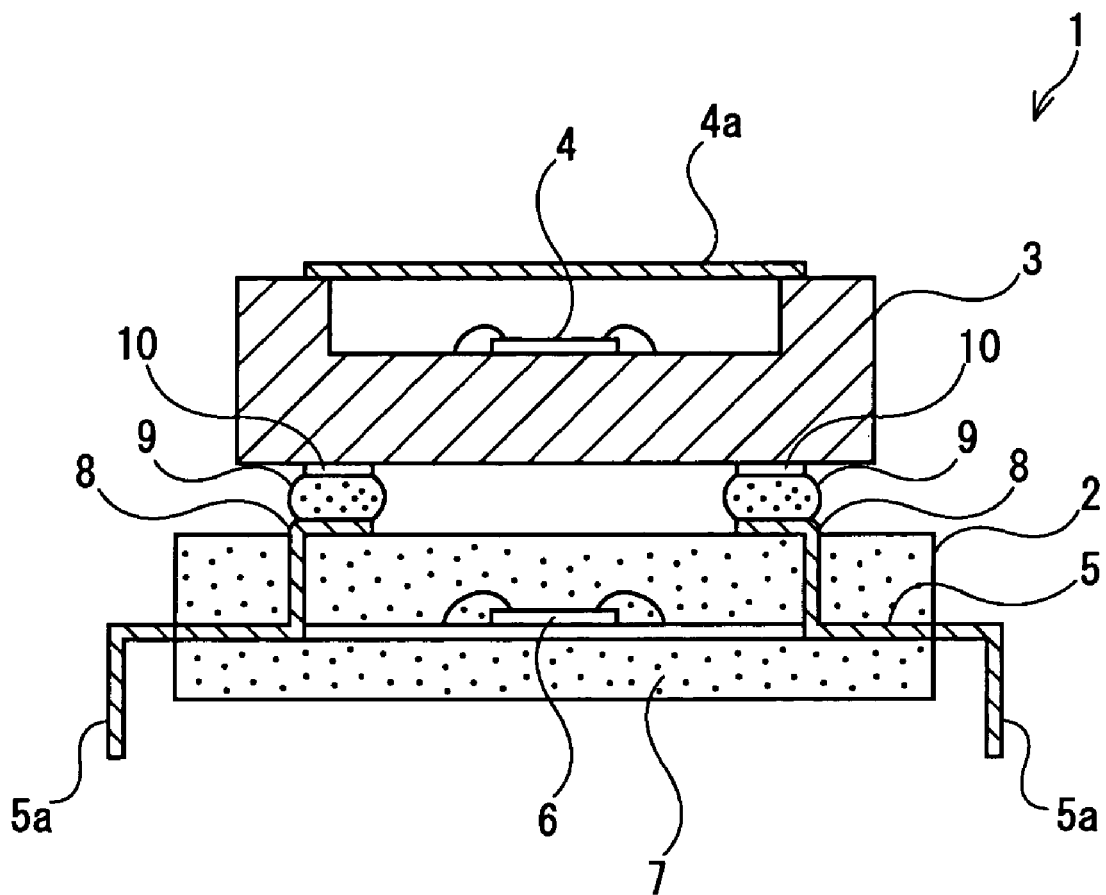
FIG. 32 is a schematic cross-sectional view illustrating an example of a related art piezoelectric oscillator.

FIG. 31 is a view illustrating the schematic construction of a digital portable phone as an example of an electronic apparatus employing the piezoelectric oscillator according to the aforementioned exemplary embodiments of the present invention.

In the figure, the transmitter's voice, which is converted into electrical signals by a microphone 308, is digitally converted in a demodulator/codec unit, is frequency-converted into RF (Radio Frequency) bands in a transmission unit 307, and then is transmitted to a base station (not shown) through an antenna. RF signals from the base station are frequency-converted in a receiving unit 306, are converted into voice signals in the demodulator/codec unit, and then are output from a speaker 309. On the other hand, a CPU (Central Processing Unit) 301 controls the operation of the whole digital portable phone 300, including an input/output unit 302 including a liquid crystal display device and a keyboard. A memory 303 for information, includes a RAM and a ROM to be controlled by the CPU 301 and stores information segments, such as control programs of the digital portable phone 300 or a telephone directory.

The piezoelectric oscillator according to the exemplary embodiments of the present invention can be applied to, for example, a TCXO (Temperature Compensated X'stal Oscillator: temperature compensated piezoelectric oscillator) 305. The TCXO 305 is a piezoelectric oscillator, in which a frequency variation due to variation in ambient temperature is reduced, and is widely used in a portable phone as a frequency reference source of the receiving unit 306 or the transmission unit 307 of FIG. 31.

Since the scale-down of the TCXO 305 is required more and more with the recent scale-down of a portable phone, the scale-down of the TCXO due to structures according to the exemplary embodiments of the present invention is very useful.

In this way, by applying the piezoelectric oscillators 30, 80, 90, 140, 150, and 160 according to the aforementioned exemplary embodiments to an electronic apparatus, such as the digital portable phone 300, it is possible to obtain the digital portable phone 300 in which the electrical connection between the first package and the second package can be easily observed externally and which is excellent in reliability.

The present invention is not limited to the exemplary embodiments described above. The constructions of the modifications of the exemplary embodiments may be properly combined and may be combined with another construction which is omitted or is not shown in the figures.

Although the first package and the second package are all rectangular in the above exemplary embodiments, packages having other shapes may be used.

What is claimed is:

1. A piezoelectric oscillator, comprising:
   a first package housing a piezoelectric resonator element therein and having external terminal portions connected to excitation electrodes of the piezoelectric resonator element; and
   a second package housing an oscillating circuit element constituting an oscillating circuit, the first package being superposed on and fixed to the second package,
   in the second package, the oscillating circuit element, connected to a lead frame and being molded out of resin, and connection terminal portions and mounting terminals formed out of the lead frame being exposed at the second package,
   the external terminal portions of the first package being exposed at side surfaces of the first package, and the external terminal portions and the connection terminal portions of the second package being electrically connected to each other by a conductive material, and
   the second package having a first lead frame, a second lead frame, and end portions of the first lead frame being bent in a direction receding from the first package and being exposed externally to form first connection terminal portions, end portions of the second lead frame being bent in a direction approaching the first package and being exposed externally to form second connection terminal portions, the first connection terminal portions and the second connection terminal portions being arranged to two-dimensionally overlap each other, the oscillating circuit element being connected to inner terminals of the first and second lead frames, the first connection terminal portions being used as the mounting terminals, and the second connection terminal portions being used as the connection terminal portions electrically connected to the external terminal portions of the first package.

2. The piezoelectric oscillator according to claim 1, material-removed portions being formed in peripheral edge portions of the first package, and the material-removed portions being provided with the external terminal portions.

3. The piezoelectric oscillator according to claim 1, the first package having a laminated structure, conductive patterns being provided in an interlayer thereof, and the conductive patterns being electrically connected to a cover bonded to the first package.

4. The piezoelectric oscillator according to claim 1, the external terminal portions being separated from a lower end of the first package by a predetermined gap.

5. The piezoelectric oscillator according to claim 1, inspection terminal portions connected to the excitation electrodes of the piezo electric resonator element being exposed at a bottom surface of the first package.

6. The piezoelectric oscillator according to claim 1, concave portions being formed in a surface of the first package bonded to the second package.

7. The piezoelectric oscillator according to claim 6, the inspection terminal portions connected to the excitation electrodes of the piezoelectric resonator element being exposed at the concave portions.

8. The piezoelectric oscillator according to claim 1, places where the external terminal portions of the first package and the connection terminal portions of the second package are connected to each other by the conductive material, and/or the inspection terminal portions being coated with a non-conductive material.

9. The piezoelectric oscillator according to claim 1, a convex portion being formed between the external terminal portions provided on the side surfaces of the first package and the cover bonded to the first package.

10. A portable phone employing a piezoelectric oscillator, the piezoelectric oscillator, comprising:
    a first package housing a piezoelectric resonator element therein and having external terminal portions connected to excitation electrodes of the piezoelectric resonator element; and
    a second package housing an oscillating circuit element constituting an oscillating circuit, the first package being superposed on and fixed to the second package, the portable phone obtaining control clock signals by using the piezoelectric oscillator,
    in the second package, the oscillating circuit element, which is connected to a lead frame, being molded out of resin, and connection terminal portions and mounting terminals formed out of the lead frame being exposed at the second package,
    the external terminal portions of the first package being exposed at side surfaces of the first package, and the external terminal portions and the connection terminal portions of the second package being electrically connected to each other by a conductive material, and
    the second package having a first lead frame, a second lead frame, and end portions of the first lead frame being bent in a direction receding from the first package and being exposed externally to form first connection terminal portions, end portions of the second lead frame being bent in a direction approaching the first package and being exposed externally to form second connection terminal portions, the first connection terminal portions and the second connection terminal portions being arranged to two-dimensionally overlap each other, the oscillating circuit element being connected to inner terminals of the first and second lead frames, the first connection terminal portions being used as the mounting terminals, and the second connection terminal portions being used as the connection terminal portions electrically connected to the external terminal portions of the first package.

11. An electronic apparatus employing a piezoelectric oscillator, the piezoelectric oscillator comprising:
- a first package housing a piezoelectric resonator element therein and having external terminal portions connected to excitation electrodes of the piezoelectric resonator element; and
- a second package housing an oscillating circuit element constituting an oscillating circuit, the first package being superposed on and fixed to the second package, the electronic apparatus obtaining control clock signals by using the piezoelectric oscillator,
- in the second package, the oscillating circuit element, which is connected to a lead frame, being molded out of resin, and connection terminal portions and mounting terminals formed out of the lead frame being exposed at the second package,
- the external terminal portions of the first package being exposed at side surfaces of the first package, and the external terminal portions and the connection terminal portions of the second package are electrically connected to each other by a conductive material, and
- the second package having a first lead frame, a second lead frame, and end portions of the first lead frame being bent in a direction receding from the first package and being exposed externally to form first connection terminal portions, end portions of the second lead frame being bent in a direction approaching the first package and being exposed externally to form second connection terminal portions, the first connection terminal portions and the second connection terminal portions being arranged to two-dimensionally overlap each other, the oscillating circuit element being connected to inner terminals of the first and second lead frames, the first connection terminal portions being used as the mounting terminals, and the second connection terminal portions being used as the connection terminal portions electrically connected to the external terminal portions of the first package.

* * * * *